United States Patent
Hatanaka et al.

(10) Patent No.: US 11,595,056 B2
(45) Date of Patent: Feb. 28, 2023

(54) ENCODING DEVICE AND METHOD, DECODING DEVICE AND METHOD, AND PROGRAM

(71) Applicant: Sony Corporation, Tokyo (JP)

(72) Inventors: Mitsuyuki Hatanaka, Kanagawa (JP); Toru Chinen, Kanagawa (JP)

(73) Assignee: Sony Corporation, Tokyo (JP)

( * ) Notice: Subject to any disclaimer, the term of this patent is extended or adjusted under 35 U.S.C. 154(b) by 418 days.

(21) Appl. No.: 16/651,532

(22) PCT Filed: Sep. 21, 2018

(86) PCT No.: PCT/JP2018/034981
§ 371 (c)(1),
(2) Date: Mar. 27, 2020

(87) PCT Pub. No.: WO2019/069710
PCT Pub. Date: Apr. 11, 2019

(65) Prior Publication Data
US 2020/0265853 A1 Aug. 20, 2020

(30) Foreign Application Priority Data
Oct. 5, 2017 (JP) .............................. JP2017-195064

(51) Int. Cl.
*H03M 7/30* (2006.01)
(52) U.S. Cl.
CPC ....... *H03M 7/6011* (2013.01); *H03M 7/6005* (2013.01)
(58) Field of Classification Search
CPC .............. H03M 7/6011; H03M 7/6005; G10L 19/167; G10L 19/20; G10L 19/008
See application file for complete search history.

(56) References Cited

U.S. PATENT DOCUMENTS

2015/0332680 A1  11/2015  Crockett et al.
2016/0104496 A1  4/2016  Purnhagen et al.
(Continued)

FOREIGN PATENT DOCUMENTS

EP  3086558 A1  10/2016
EP  3151240 A1  4/2017
(Continued)

OTHER PUBLICATIONS

International Written Opinion dated Dec. 11, 2018 in connection with International Application No. PCT/JP2018/034981, and English translation thereof.
International Preliminary Report on Patentability dated Apr. 16, 2020 in connection with International Application No. PCT/JP2018/034981, and English translation thereof.
(Continued)

*Primary Examiner* — Khai M Nguyen
(74) *Attorney, Agent, or Firm* — Wolf, Greenfield & Sacks, P.C.

(57) ABSTRACT

The present technology relates to an encoding device and method, a decoding device and method, and a program, which are adapted to be capable of improving convenience. The decoding device is provided with: a decoding unit that decodes audio data including an object audio, the audio data being included in an encoded bit stream, and reads metadata of the object audio from an area in which arbitrary data of the encoded bit stream can be stored; and an output unit that outputs the decoded audio data on the basis of the metadata. The present technology can be applied to the decoding device.

23 Claims, 21 Drawing Sheets

(56) References Cited

U.S. PATENT DOCUMENTS

| | | | |
|---|---|---|---|
| 2016/0142850 A1* | 5/2016 | Borss | G10L 19/008 |
| | | | 381/23 |
| 2016/0295257 A1 | 10/2016 | Iguchi et al. | |
| 2017/0092280 A1* | 3/2017 | Hirabayashi | G10K 15/02 |
| 2017/0289720 A1 | 10/2017 | Tsukagoshi | |
| 2018/0315436 A1 | 11/2018 | Yamamoto | |

FOREIGN PATENT DOCUMENTS

| | | |
|---|---|---|
| EP | 3208801 A1 | 8/2017 |
| EP | 3316599 A1 | 5/2018 |
| JP | 2015-119477 A | 6/2015 |
| JP | 2016-509249 A | 3/2016 |
| JP | 2016-522911 A | 8/2016 |
| WO | WO 2013/006338 A2 | 1/2013 |
| WO | WO 2014/099285 A1 | 6/2014 |
| WO | WO 2014/187990 A1 | 11/2014 |
| WO | WO-2014194106 A1 | 12/2014 |
| WO | WO 2015/182491 A1 | 12/2015 |
| WO | WO 2016/060101 A1 | 4/2016 |
| WO | WO 2016/203994 A1 | 12/2016 |

OTHER PUBLICATIONS

Extended European Search Report dated Oct. 8, 2020 in connection with European Application No. 18864075.9.

International Search Report and English translation thereof dated Dec. 11, 2018 in connection with International Application No. PCT/JP2018/034981.

[No. Author Listed], Information technology—Coding of audio-visual objects—Part 3: Audio. International Standard ISO/IEC 14496-3. Fourth edition. Sep. 1, 2009. 1416 pages.

[No Author Listed], Information technology—Coding of moving pictures and associated audio for digital storage media at up to about 1,5 Mbit/s—Part 3: Audio. International Standard ISO/IEC 11172-3. First edition. Aug. 1, 1993. 157 pages.

* cited by examiner

FIG. 15

| Syntax | No. of Bits |
|---|---|
| dse_div_info() { | |
| dse_div_cnt | 3 |
| dse_div_terminate | 1 |
| } | |

FIG. 16

| Syntax | No. of Bits |
|---|---|
| frame_div_info() { | |
|   frm_div_mode | 1 |
|   if(frm_div_mode == 1) { | |
|     frm_div_cnt | 3 |
|     frm_div_terminate | 1 |
|     If(frm_div_cnt == 0) { | |
|       apply_frm_index | 3 |
|     } | |
|   } | |
| } | |

FIG. 17

| Syntax | No. of Bits |
|---|---|
| div_info() { | |
|   dse_div_info(); | |
|   if(dse_div_cnt == 0) { | 1 |
|     frame_div_info(); | |
|   } | |
| } | |

ENCODING DEVICE AND METHOD, DECODING DEVICE AND METHOD, AND PROGRAM

CROSS-REFERENCE TO RELATED APPLICATIONS

This application claims the benefit under 35 U.S.C. § 371 as a U.S. National Stage Entry of International Application No. PCT/JP2018/034981, filed in the Japanese Patent Office as a Receiving Office on Sep. 21, 2018, which claims priority to Japanese Patent Application Number JP2017-195064, filed in the Japanese Patent Office on Oct. 5, 2017, each of which is hereby incorporated by reference in its entirety.

TECHNICAL FIELD

The present technology relates to an encoding device and method, a decoding device and method, and a program, and in particular, relates to an encoding device and method, a decoding device and method, and a program, which are adapted to be capable of improving convenience.

BACKGROUND ART

Conventionally, audio encoding technologies such as advanced audio coding (AAC), and moving picture experts group 2 audio layer 3 (MP3) are known (for example, refer to Non-Patent Document 1, and Non-Patent Document 2).

These audio encoding technologies such as AAC and MP3 are used for various uses including music distribution, and have achieved actual results from the viewpoint of sound quality and implementation.

CITATION LIST

Non-Patent Document

Non-Patent Document 1: ISO/IEC 14496-3:2009 Information technology—Coding of audio-visual objects—Part 3: Audio Non-Patent Document 2: ISO/IEC 11172-3:1993 Information technology—Coding of moving pictures and associated audio for digital storage media at up to about 1.5 Mbit/s—Part 3: Audio

SUMMARY OF THE INVENTION

Problems to be Solved by the Invention

However, these audio encoding technologies, in other words, the conventional audio encoding standards, are encoding technologies based on the premise that channel-based audio data is handled.

Therefore, object audio data used for reproducing three-dimensional audio (3D Audio), and 3D Audio metadata that includes position information of each piece of object audio data, could not be encoded just as they are.

For such a reason, in order to use the above-described audio encoding standards for 3D Audio, it is expected that the standards are extended while compatibility with the conventional standards is maintained.

The present technology has been devised in consideration of such a situation, and is adapted to be capable of improving convenience.

Solutions to Problems

A decoding device according to a first aspect of the present technology is provided with: a decoding unit that decodes audio data including an object audio, the audio data being included in an encoded bit stream, and reads metadata of the object audio from an area in which arbitrary data of the encoded bit stream can be stored; and an output unit that outputs the decoded audio data on the basis of the metadata.

A decoding method or program according to the first aspect of the present technology includes the steps of: decoding audio data including an object audio, the audio data being included in an encoded bit stream, and reading metadata of the object audio from an area in which arbitrary data of the encoded bit stream can be stored; and outputting the decoded audio data on the basis of the metadata.

In the first aspect of the present technology, audio data including an object audio is decoded, the audio data being included in an encoded bit stream, metadata of the object audio is read from an area in which arbitrary data of the encoded bit stream can be stored, and the decoded audio data is output on the basis of the metadata.

An encoding device according to a second aspect of the present technology is provided with an encoding unit that encodes audio data including an object audio, and stores metadata of the object audio in an area in which arbitrary data can be stored, to generate an encoded bit stream that includes the metadata, and the encoded audio data.

An encoded method or program according to the second aspect of the present technology includes a step of encoding audio data including an object audio, and storing metadata of the object audio in an area in which arbitrary data can be stored, to generate an encoded bit stream that includes the metadata, and the encoded audio data.

In the second aspect of the present technology, audio data including an object audio is encoded, and metadata of the object audio is stored in an area in which arbitrary data can be stored, to generate an encoded bit stream that includes the metadata, and the encoded audio data.

Effects of the Invention

According to the first and second aspects of the present technology, convenience can be improved.

It should be noted that the effects described herein are not necessarily limited, and may be any one of the effects described in the present disclosure.

BRIEF DESCRIPTION OF DRAWINGS

FIG. 15 is a diagram illustrating DSE division information in a frame.

FIG. 16 is a diagram illustrating frame division information.

FIG. 17 is a diagram illustrating division information.

MODE FOR CARRYING OUT THE INVENTION

Figure 1:
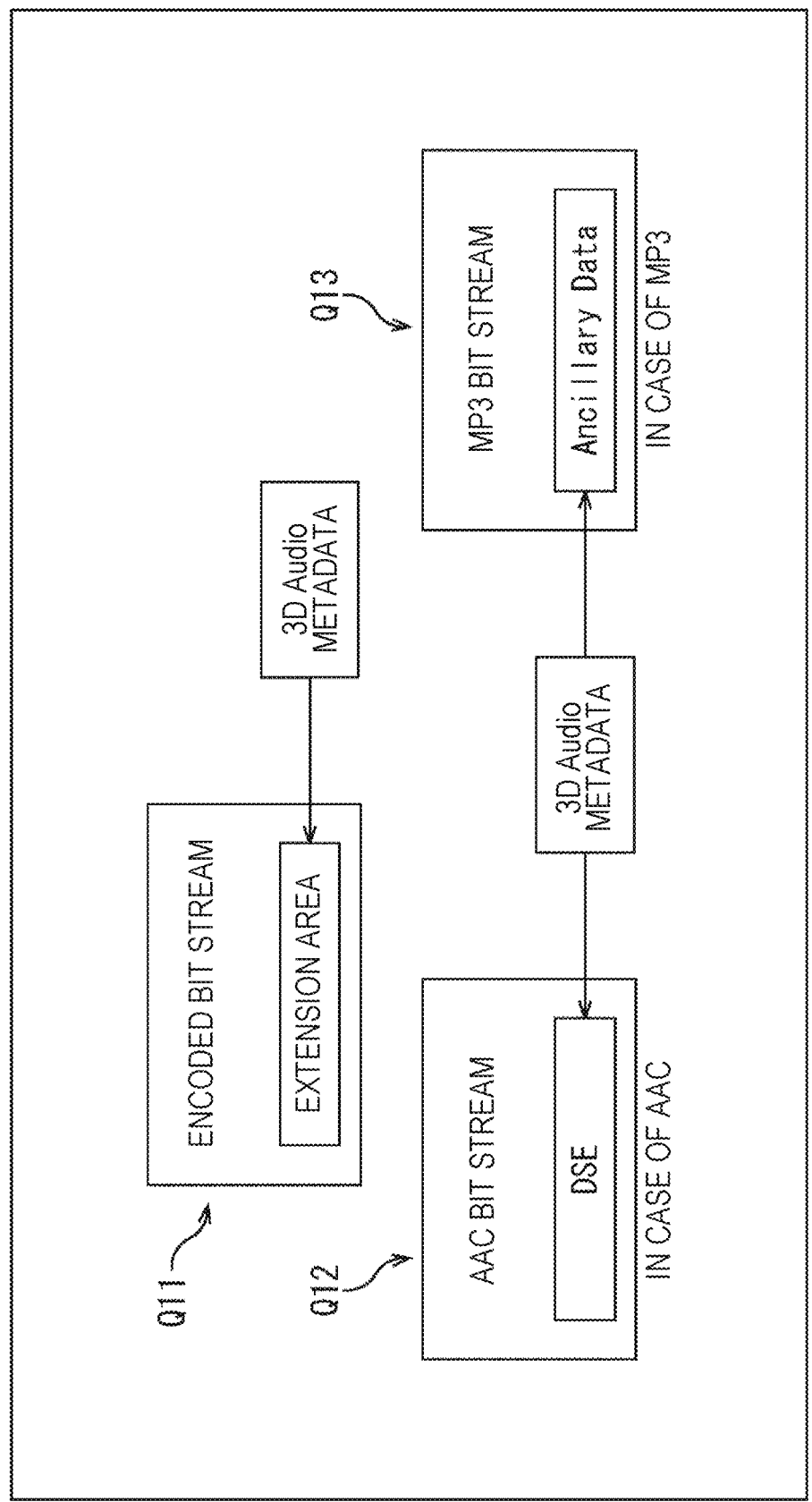
FIG. 1 is a diagram illustrating the present technology.

Embodiments to which the present technology is applied will be described below with reference to the accompanying drawings.

First Embodiment

<About the Present Technology>

According to the present technology, even if an encoding method such as AAC and MP3 is used, the encoding method not being originally based on the assumption that 3D Audio, in other words, object audio data is handled, convenience is improved by encoding and transmitting object audio data and 3D Audio metadata to enable the decoding side to realize 3D Audio reproduction.

The present technology in particular has features such as those described below.

Feature (1)

In codec such as AAC that does not support 3D Audio, 3D Audio metadata that is required for rendering of 3D Audio is stored in an ancillary data area.

Feature (2)

In a case where one ancillary data area is not enough to store 3D Audio metadata, the 3D Audio metadata is stored in a plurality of ancillary data areas.

Feature (3)

In a case where 3D Audio metadata intermittently exists, the last obtained 3D Audio metadata among pieces of 3D Audio metadata that have been already obtained is applied to a frame to be reproduced.

Feature (4)

By describing information related to a configuration of 3D Audio data in a comment field of a codec layer, audio data is transmitted while conventional codec (encoding) standards are maintained.

Feature (5)

In a case where an ancillary data area of one frame is not enough to store 3D Audio metadata, 3D Audio metadata is transmitted over a plurality of frames. In that case, on the encoding device side, 3D Audio metadata that should be stored is subjected to thinning processing on an original frame basis, and representative values of 3D Audio metadata of a plurality of frames are transmitted.

Feature (6)

Channel mapping of 3D Audio is assigned to existing channel mapping as much as possible, and information indicating the channel mapping is stored in a bit stream, and is then transmitted.

According to the present technology having the features such as those described above, reproduction of 3D Audio can be realized using existing encoding techniques such as AAC and MP3 with the compatibility of the encoding techniques maintained.

Specifically, for example, with respect to 3D Audio, a sound image of a sound source such as an audio object can be localized at an arbitrary position in a three-dimensional space.

With respect to such 3D Audio, not only an audio element that includes audio data of an audio object, in other words, object-based audio data and channel-based audio data, but also 3D Audio metadata is required.

Here, the 3D Audio metadata is data that includes, for example, position information indicating a position in a three-dimensional space of the audio object, and gain information used for gain adjustment of audio data of the audio object.

However, the encoding method such as AAC and MP3 is not basically based on the assumption that such 3D Audio metadata is handled. Therefore, 3D Audio metadata cannot be encoded and transmitted as it is.

Accordingly, in the present technology, as shown by an arrow Q11 of FIG. 1, encoded 3D Audio metadata is stored in an extension area provided in an encoded bit stream that stores audio data.

Consequently, even in the case of an encoded bit stream based on an encoding method that does not support 3D Audio, 3D Audio metadata can be transmitted, and 3D Audio can be reproduced.

Here, the extension area in which 3D Audio metadata is stored is an area that is defined by an existing encoding technique, and that allows a user to record free data according to specific rules. In other words, the extension area is an area that can store arbitrary data, and is also called ancillary data area.

Specifically, for example, in a case where the present technology is applied to the AAC encoding technique, as shown by an arrow Q12, a data stream element (DSE) is provided in an AAC bit stream, which is an encoded bit stream, as an area corresponding to the extension area of the example shown by the arrow Q11. Accordingly, when audio data is encoded by the AAC encoding method, encoded 3D Audio metadata is stored in the DSE as ancillary data.

For example, in a case where a decoding device that has received an AAC bit stream shown by the arrow Q12 supports 3D Audio, that is to say, 3D Audio metadata, the decoding device is capable of reading 3D Audio metadata from the AAC bit stream, then decoding the 3D Audio metadata, and using the 3D Audio metadata to reproduce 3D Audio.

Meanwhile, a decoding device that does not support 3D Audio metadata is not capable of interpreting 3D Audio metadata as ancillary data described in the DSE.

However, the decoding device is capable of obtaining data size information that is defined by AAC standards, and that indicates data size of ancillary data recorded in the DSE. Therefore, the decoding device is capable of skipping a 3D Audio metadata part in the DSE by using the data size information, and is capable of maintaining the compatibility with the AAC standards.

In addition, in a case where the present technology is applied to MP3, as shown by an arrow Q13, an ancillary data area is provided in an MP3 bit stream, which is an encoded bit stream, as an area corresponding to the extension area of the example shown by the arrow Q11. Accordingly, when audio data is encoded by the MP3 encoding method, encoded 3D Audio metadata is stored in an ancillary data area as ancillary data.

Then, the present technology will be described below in more detail. In order to make explanation specific, an example in which the present technology is applied to the AAC standards, in other words, an example in which by using the AAC encoding technique, 3D Audio is reproduced with the compatibility of the AAC standards maintained, will be described below.

Figure 2:
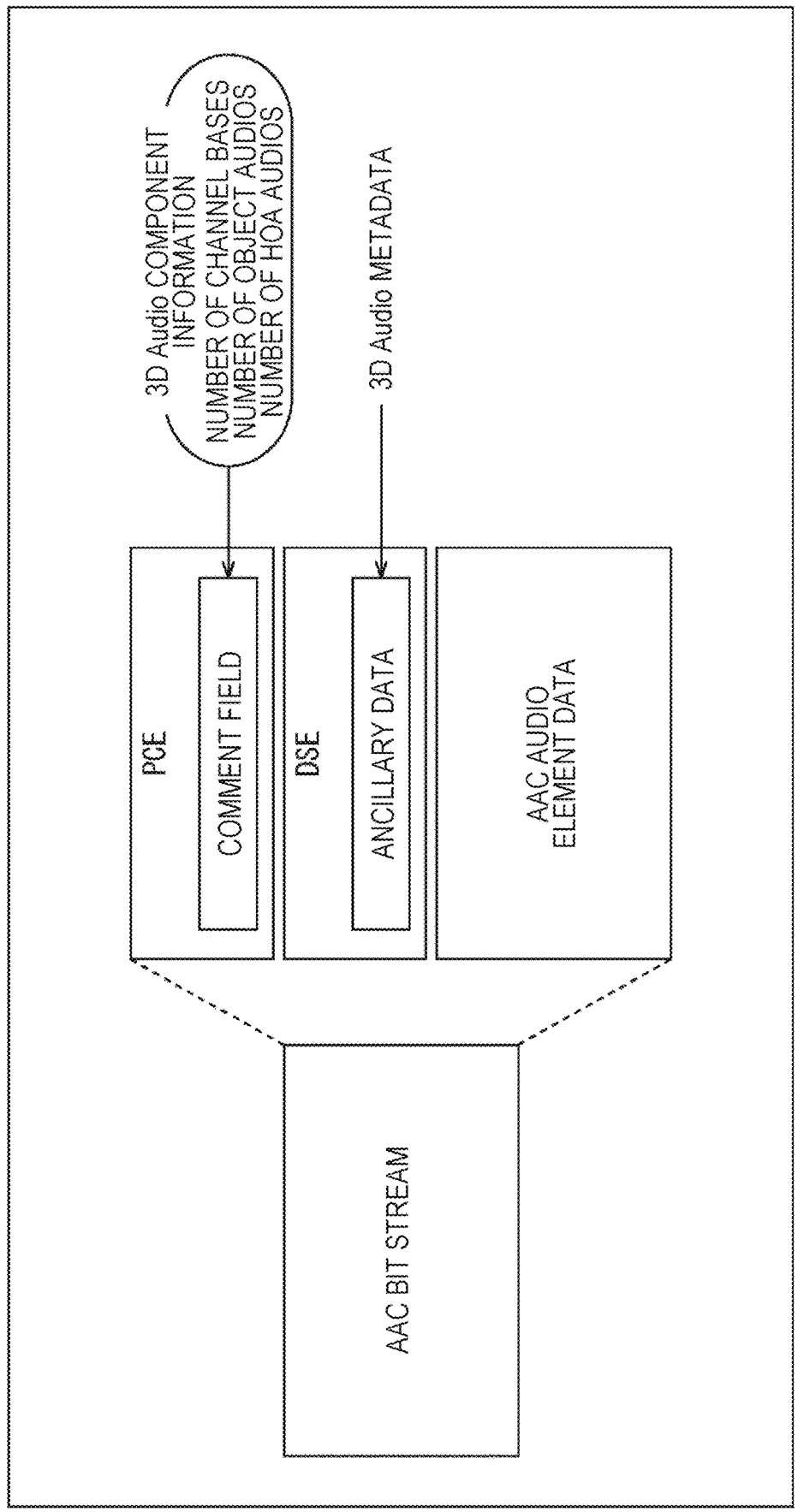
FIG. 2 is a diagram illustrating an AAC bit stream.

In a case where the present technology is applied to the AAC standards, an AAC bit stream, in other words, an encoded bit stream obtained by encoding audio data according to AAC, has a configuration shown in FIG. 2.

In other words, the AAC bit stream is provided with program config element (PCE) and DSE; and AAC audio element data that includes audio data used for reproduction is stored in the AAC bit stream.

For example, as audio data for realizing reproduction of 3D Audio, the AAC audio element data includes at least any of audio data of an audio object, channel-based audio data, or high order ambisonic (HOA)-based audio data.

Here, the audio data of the audio object, in other words, object-based audio data, is what is called object audio, and is an audio signal for reproducing a sound of the audio object. In addition, the channel-based audio data is, for example, an audio signal of each channel having a predetermined channel configuration such as 5.1 channel and 22.2 channel, in other words, an audio signal of a sound reproduced by a speaker corresponding to each channel.

Moreover, the HOA-based audio data is an audio signal having an ambisonic format. In other words, the HOA-based audio data is audio data that expresses the channel-based audio signal in an ambisonic format. It should be noted that hereinafter, the HOA-based audio data is also referred to as "ambisonic-based audio data".

Hereinafter, in a case where it is not particularly necessary to distinguish among the audio data of the audio object, the channel-based audio data, and the ambisonic-based audio data, they are also merely referred to as "audio data".

3D Audio component information indicating components of AAC audio element data is stored in a comment field that is capable of storing arbitrary data in a PCE of an AAC bit stream. Here, 3D Audio component information is information indicating: the number of channel bases, which is the number of pieces of channel-based audio data that constitute AAC audio element data; the number of object audios, which is the number of pieces of audio data of an audio object; and the number of HOA audios, which is the number of pieces of ambisonic-based audio data.

Moreover, 3D Audio metadata that is metadata of audio data constituting the AAC audio element data is stored, as ancillary data, in the DSE of the AAC bit stream.

Here, the channel-based metadata, the object-based metadata, and the ambisonic-based metadata are included as the 3D Audio metadata.

For example, the channel-based metadata is metadata of channel-based audio data, and includes associated channel information indicating which channel each channel-based audio data is associated with.

In addition, the object-based metadata is metadata of audio data of an audio object, and includes: number-of-objects information indicating the number of audio objects; position information indicating a position of each audio object in a three-dimensional space; and gain information indicating a gain that is multiplied by audio data of each audio object.

Moreover, the ambisonic-based metadata is metadata of ambisonic-based audio data, and includes information indicating the order and mode of ambisonics.

It should be noted that hereinafter, the AAC bit stream obtained by applying the present technology, in other words, an encoded bit stream that is based on AAC, and in which 3D Audio metadata is stored, is also particularly referred to as "3D AAC bit stream".

<Configuration Example of Encoding Device>

Subsequently, an encoding device that generates a 3D AAC bit stream described above, and a decoding device that receives and decodes the 3D AAC bit stream output from the encoding device, will be described.

Figure 3:
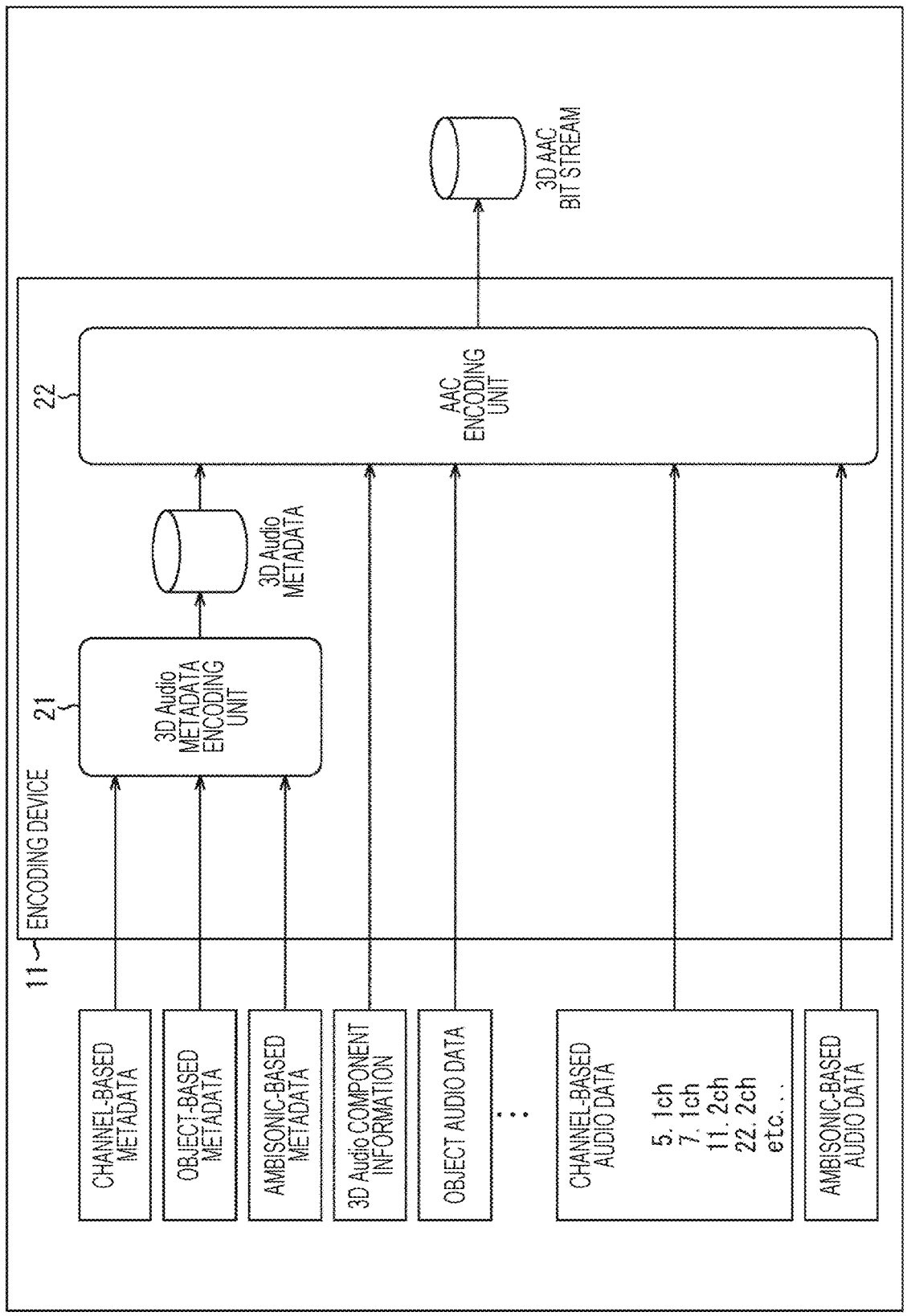
FIG. 3 is a diagram illustrating a configuration example of an encoding device.

FIG. 3 is a diagram illustrating a configuration example of an encoding device to which the present technology is applied.

An encoding device 11 shown in FIG. 3 includes a 3D Audio metadata encoding unit 21, and an AAC encoding unit 22.

In the encoding device 11, channel-based metadata, object-based metadata, and ambisonic-based metadata are supplied from the outside to the 3D Audio metadata encoding unit 21 as 3D Audio metadata.

In addition, various audio data and 3D Audio component information are supplied from the outside to the AAC encoding unit 22, the various audio data including audio data (object audio) of an audio object, channel-based audio data, and ambisonic-based audio data. Here, each audio data is a pulse code modulation (PCM) signal for reproducing content; and one or a plurality of pieces of audio data including at least object audio is supplied from the outside to the AAC encoding unit 22.

The 3D Audio metadata encoding unit 21 encodes 3D Audio metadata supplied from the outside, and supplies the encoded 3D Audio metadata to the AAC encoding unit 22. Hereinafter, the 3D Audio metadata that has been encoded by the 3D Audio metadata encoding unit 21 is also referred to as "encoded 3D Audio metadata".

The AAC encoding unit 22 encodes the encoded 3D Audio metadata supplied from the 3D Audio metadata encoding unit 21, and the 3D Audio component information and the audio data, which have been supplied from the outside, by the AAC encoding method to generate a 3D AAC bit stream, and then outputs the 3D AAC bit stream.

Here, since audio data supplied to the AAC encoding unit 22 is a PCM signal, those pieces of audio data can be encoded as AAC audio element data based on the AAC standards.

It should be noted that as an alternative to supplying 3D Audio component information from the outside to the AAC encoding unit 22, the AAC encoding unit 22 may be adapted to be supplied with required information from the 3D Audio metadata encoding unit 21, and to generate 3D Audio component information on the basis of the information.

<Configuration Example of Decoding Device>

Next, a configuration of a decoding device that receives and decodes the 3D AAC bit stream output from the encoding device 11 shown in FIG. 3 will be described. Such a decoding device is configured as shown in, for example, FIG. 4.

Figure 4:
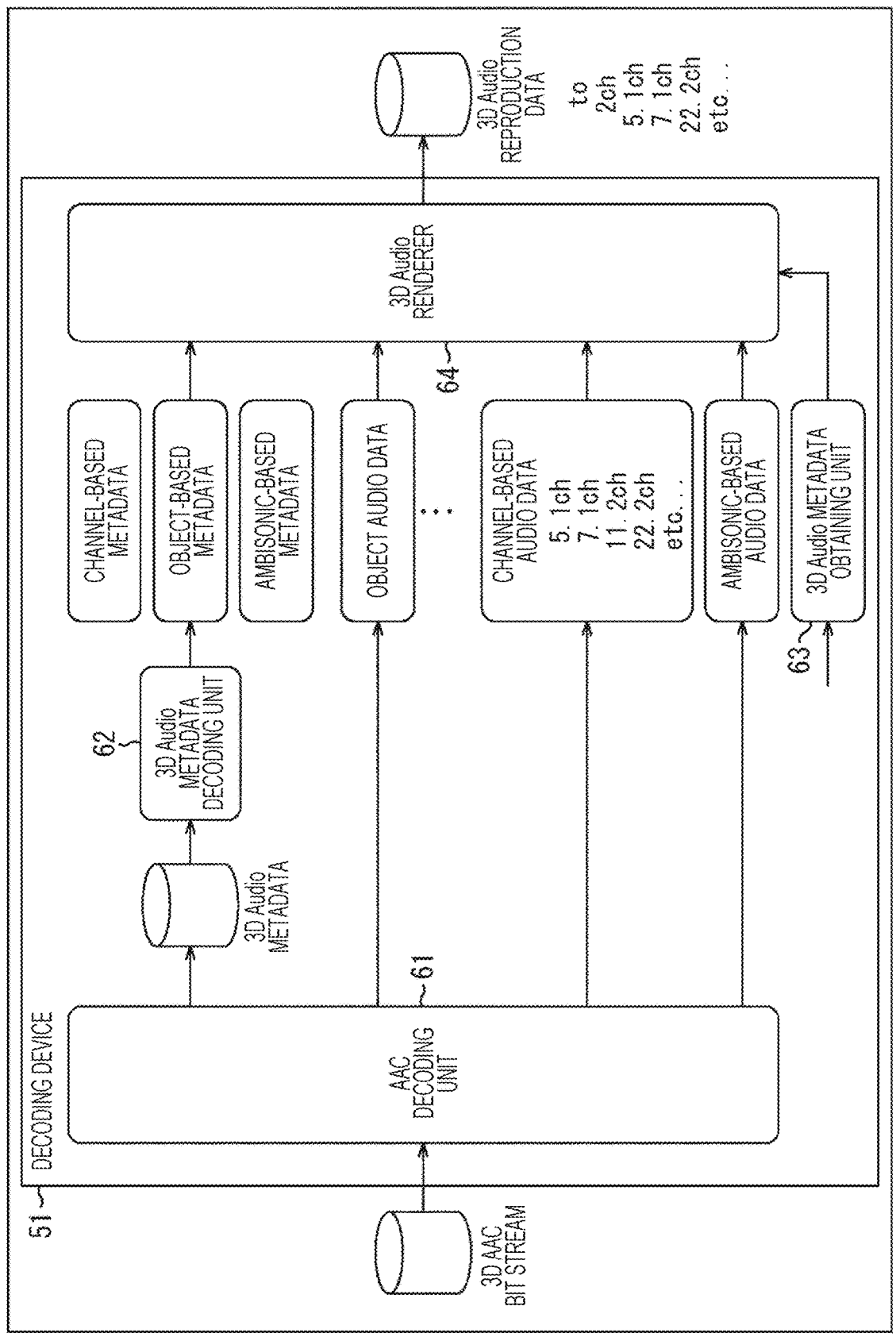
FIG. 4 is a diagram illustrating a configuration example of a decoding device.

A decoding device 51 shown in FIG. 4 includes an AAC decoding unit 61, a 3D Audio metadata decoding unit 62, a 3D Audio metadata obtaining unit 63, and a 3D Audio renderer 64.

The AAC decoding unit 61 receives a 3D AAC bit stream transmitted from the encoding device 11, and decodes the received 3D AAC bit stream.

The AAC decoding unit 61 supplies encoded 3D Audio metadata obtained by decoding the 3D AAC bit stream to the 3D Audio metadata decoding unit 62, and supplies audio data obtained by decoding, in other words, a PCM signal, to the 3D Audio renderer 64.

Here, audio data that is supplied from the AAC decoding unit 61 to the 3D Audio renderer 64 is audio data (object audio data) of an audio object, channel-based audio data, ambisonic-based audio data, and the like.

In addition, the AAC decoding unit 61 supplies, as appropriate, 3D Audio component information obtained by decoding to an upper level control unit that controls the decoding device 51.

The 3D Audio metadata decoding unit 62 decodes the encoded 3D Audio metadata supplied from the AAC decoding unit 61, and supplies channel-based metadata, object-based metadata and ambisonic-based metadata as 3D Audio metadata obtained as a result thereof to the 3D Audio renderer 64.

The 3D Audio metadata obtaining unit 63 obtains 3D Audio metadata, as appropriate, by obtaining required information from the outside to generate 3D Audio metadata, or by receiving 3D Audio metadata from an external server or the like, and then supplies the 3D Audio metadata to the 3D Audio renderer 64.

The 3D Audio renderer 64 functions as an output unit that performs rendering processing to generate reproduction data for 3D Audio reproduction, and that outputs the obtained reproduction data, in other words, functions as an output unit that outputs decoded audio data on the basis of 3D Audio metadata.

Specifically, the 3D Audio renderer 64 performs rendering on the basis of the 3D Audio metadata supplied from the 3D Audio metadata decoding unit 62 or the 3D Audio metadata obtaining unit 63, and the audio data supplied from the AAC decoding unit 61, and generates audio data having a predetermined number of channels as reproduction data.

The reproduction data is, for example, an audio signal for realizing 3D Audio reproduction, the audio signal including audio data of each channel having a predetermined channel configuration such as 2 channel and 5.1 channel. If a sound is reproduced on the basis of this reproduction data, for example, a sound image of a sound of an audio object can be localized at a position in a three-dimensional space indicated by position information included in 3D Audio metadata of the audio object.

The 3D Audio renderer 64 outputs the obtained reproduction data to the outside. For example, the 3D Audio renderer 64 supplies the reproduction data to a speaker to regenerate a sound, and supplies the reproduction data to an unillustrated recording unit, and causes the recording unit to record the reproduction data.

<Configuration Example of 3D AAC Bit Stream>

Here, a specific configuration example of a 3D AAC bit stream that is given and received between the encoding device 11 and the decoding device 51 such as those described above will be described.

For example, it is assumed that AAC audio element data is configured from 7.1 channel channel-based audio data, audio data of two audio objects, and ambisonic-based first-order ambisonic audio data.

Figure 5:
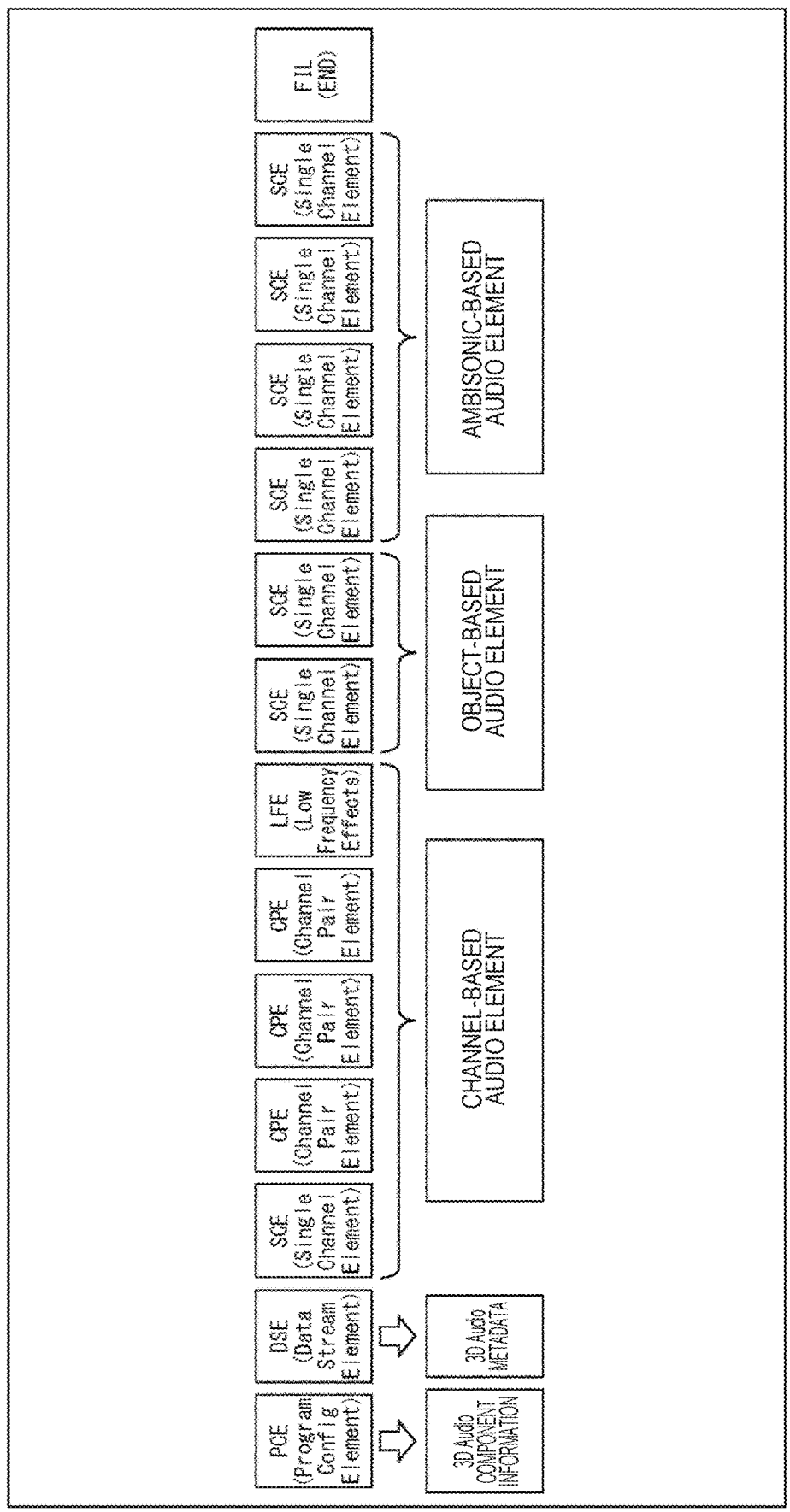
FIG. 5 is a diagram illustrating a configuration example of a 3D AAC bit stream.

In such a case, the 3D AAC bit stream is configured as shown in, for example, FIG. 5. In this example, a PCE and a DSE are arranged at the top of a 3D AAC bit stream for one frame of audio data. In addition, 3D Audio component information is stored in the PCE; and encoded 3D Audio metadata is stored in the DSE.

Further, subsequent to the DSE, one single channel element (SCE), three channel pair elements (CPEs), and one low frequency effect (LFE) are arranged. In addition, 7.1 channel channel-based audio data is stored in these SCE, CPEs and LFE so as to form a channel-based audio element.

Moreover, after the channel-based audio element, two SCEs are arranged, and pieces of audio data of two audio objects are stored in those SCEs so as to form an object-based audio element.

Subsequent to the object-based audio element, four SCEs are arranged, and ambisonic-based first-order ambisonic audio data is stored in those SCEs so as to form an ambisonic-based audio element.

In addition, after the ambisonic-based audio element, in other words, at the terminal of the 3D AAC bit stream for one frame, FIL is arranged.

In this manner, in the example shown in FIG. 5, the AAC audio element data is configured from the channel-based audio element, the object-based audio element, and the ambisonic-based audio element.

It should be noted that the AAC audio element data may be configured from at least any one of the channel-based audio element, the object-based audio element, or the ambisonic-based audio element.

<About Transmission of 3D Audio Meta Data>

Incidentally, with respect to 3D Audio, 3D Audio metadata is basically transmitted on a frame basis. However, in the case of, for example, a frame section in which no audio object movement occurs, when 3D Audio metadata is not always required for each of a plurality of frames, 3D Audio metadata is not required to be transmitted on a frame basis.

Figure 6:
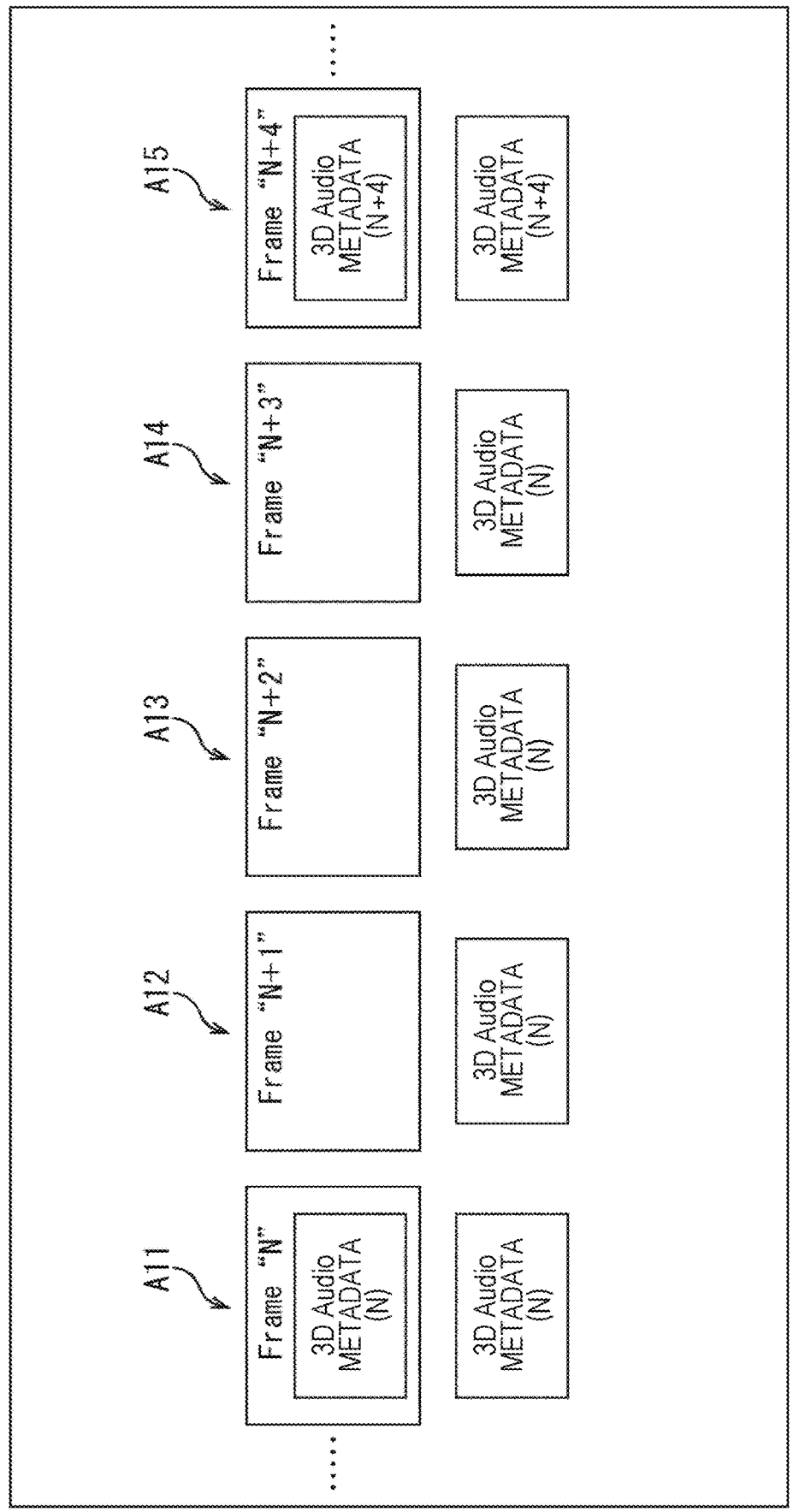
FIG. 6 is a diagram illustrating application of 3D Audio metadata.

In such a case, as shown in, for example, FIG. 6, in a frame in which 3D Audio metadata has not been transmitted, a piece of 3D Audio metadata that has been obtained temporally last among pieces of 3D Audio metadata of frames before the frame is used as 3D Audio metadata of a current frame.

In the example shown in FIG. 6, respective quadrangles indicated by arrows A11 to A15 represent 3D AAC bit streams of a frame N to a frame (N+4) respectively. It should be noted that hereinafter, a 3D AAC bit stream for one frame is also referred to as "AAC frame data".

For example, in the frame N, AAC frame data stores 3D Audio metadata of the frame N, and therefore the decoding device 51 performs rendering by using the 3D Audio metadata of the frame N (hereinafter also referred to as "3D Audio metadata (N)") obtained by decoding.

Meanwhile, in the next frame (N+1), 3D Audio metadata is not stored in AAC frame data. Accordingly, the decoding device 51 uses 3D Audio metadata (N) of the frame N that has been obtained last, in other words, that has been obtained last by decoding, to perform rendering of the frame (N+1).

In this manner, in a case where 3D Audio metadata of a current frame does not exist, 3D Audio metadata of a frame that is temporally nearest to the current frame among pieces of 3D Audio metadata of frames temporally before the current frame, which have already been read from the DSE of the 3D AAC bit stream, is used as 3D Audio metadata of the current frame.

In other words, a piece of 3D Audio metadata that has been read temporally last among pieces of 3D Audio metadata read from DSEs of frames before the current frame is used as 3D Audio metadata of the current frame, and rendering of the current frame is performed. Further speaking, in a case where 3D Audio metadata of a current frame does not exist as the result, 3D Audio metadata that has been used in the frame immediately before the current frame is used as 3D Audio metadata of the current frame.

As with the case of the frame (N+1), in the subsequent frames (N+2) and (N+3) as well, 3D Audio metadata is not stored in those frames, and therefore rendering is performed by using 3D Audio metadata (N) of the frame N that has been obtained last.

Meanwhile, in the frame (N+4) subsequent to the frame (N+3), 3D Audio metadata (N+4) of the frame (N+4) is obtained by decoding, and therefore rendering is performed by using the 3D Audio metadata (N+4).

Incidentally, in a case where nothing is stored in the DSE in the current frame, with the result that it has been determined that 3D Audio metadata is not stored, pieces of 3D Audio metadata of frames temporally before the current frame can be referred to.

In this case, it can also be said that the determination that 3D Audio metadata is not stored in the DSE of the current frame represents an instruction to refer to pieces of 3D Audio metadata of frames temporally before the current frame.

Besides the above, the DSE may be adapted to store not only 3D Audio metadata, but also a previous frame reference flag indicating whether or not pieces of 3D Audio metadata of frames temporally before the current frame are used (referred to).

That is to say, the previous frame reference flag is information that gives an instruction as to whether to use, as 3D Audio metadata of the current frame, a piece of 3D Audio metadata that has been read temporally last among pieces of 3D Audio metadata read from DSEs of frames before the current frame.

In other words, the previous frame reference flag is information that gives an instruction as to whether to use, as 3D Audio metadata of the current frame, 3D Audio metadata of a frame nearest to the current frame among pieces of 3D Audio metadata that have been stored in DSEs of frames temporally before the current frame.

In this case, for example, in a case where 3D Audio metadata of the previous frame is referred to, a value of the previous frame reference flag is set at "1", and only the previous frame reference flag having a value of 1 is described in the DSE.

Meanwhile, in a case where 3D Audio metadata of the previous frame is not referred to, a value of the previous frame reference flag is set at "0", and subsequent to the previous frame reference flag having a value of 0, 3D Audio metadata is described in the DSE. Explanation will be continued below on the assumption that the previous frame reference flag is stored in the DSE.

In addition, 3D Audio metadata is data that is stored in the DSE, and is data that is independent from the AAC encoding standards.

Therefore, in a case where a 3D AAC bit stream is reproduced from the middle, in other words, in a case where content is reproduced from the middle, even if a frame (audio data) based on the AAC standards could be decoded, there is a case where decoding of 3D Audio metadata is not completed. This results from that in a case where 3D Audio metadata is encoded by difference encoding, a starting point of difference is unknown until a reset frame that is not subjected to difference encoding appears.

In addition, in a case where a 3D AAC bit stream is reproduced from the middle, there is also a case where 3D Audio metadata is omitted in some frames.

Accordingly, in the present technology, in a case where 3D Audio metadata of a current frame cannot be obtained, 3D Audio metadata of a temporally previous frame is used as it is, and alternatively a default value of 3D Audio metadata that is held on the decoding device 51 side beforehand can be used.

It should be noted that hereinafter, other 3D Audio metadata that differs from 3D Audio metadata read from the 3D AAC bit stream is also referred to as "externally obtained 3D Audio metadata", the other 3D Audio metadata including a default value that is held on the decoding device 51 side beforehand.

Figure 7:
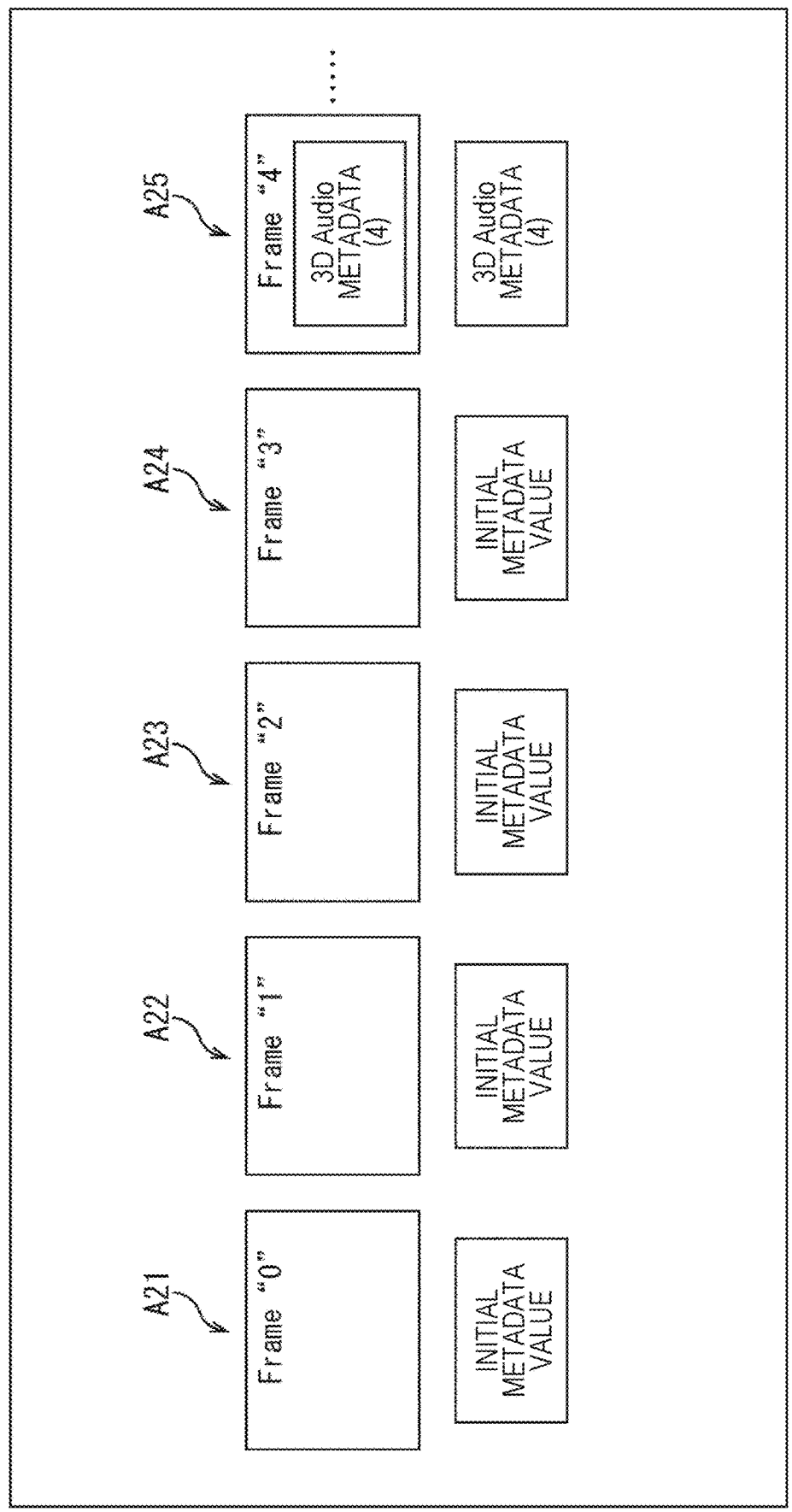
FIG. 7 is a diagram illustrating use of externally obtained 3D Audio metadata.

As shown in, for example, FIG. 7, it is assumed that 3D Audio metadata could not have been obtained in some frames of a head part of content.

In FIG. 7, respective quadrangles indicated by arrows A21 to A25 represent respective pieces of AAC frame data of frames 0 to 4.

In this example, although audio data based on the AAC standards could have been decoded from the top frame 0 to the fourth frame 3, 3D Audio metadata does not exist for reasons that 3D Audio metadata could not have been decoded, and 3D Audio metadata is not stored in the DSE.

Accordingly, the 3D Audio metadata obtaining unit 63 obtains a predetermined initial metadata value as externally obtained 3D Audio metadata, and supplies the initial metadata value to the 3D Audio renderer 64.

For example, in the initial metadata value, a position indicated by position information of an audio object is, for example, a predetermined position such as a position directly in front of a user in a three-dimensional space.

In addition, when an initial metadata value is obtained, for example, the 3D Audio metadata obtaining unit 63 obtains an initial metadata value serving as externally obtained 3D Audio metadata on the basis of 3D Audio component information read from the PCE. Specifically, for example, on the basis of the number of object audios indicated by 3D Audio component information, pieces of position information and pieces of gain information are obtained, the number of pieces being equivalent to the number of audio objects.

In a case where externally obtained 3D Audio metadata is obtained, a specific configuration of AAC audio element data, in other words, information indicating a configuration of audio data, such as the number of channel bases and the number of object audios, is required. Therefore, a value of the previous frame reference flag is set at "1" in, for example, the encoding device 11, and in a case where 3D Audio metadata is not stored in the DSE, 3D Audio component information is always described in the PCE.

When the 3D Audio renderer 64 is supplied with an initial metadata value serving as externally obtained 3D Audio metadata, the 3D Audio renderer 64 subjects frames 0 to 3 to rendering by using the supplied initial metadata value. Subsequently, when 3D Audio metadata is read from the DSE in the frame 4, the frame 4 is subjected to rendering on the basis of the read 3D Audio metadata.

In this manner, in a case where 3D Audio metadata has not been obtained from the DSE in the head part, the middle part or the like of content for a long time, 3D Audio can be reproduced for the present if the externally obtained 3D Audio metadata obtained on the basis of the 3D Audio component information or the like is used.

For example, on the encoding device 11 side, when 3D Audio metadata does not change over a plurality of frames, for example, in a case where no object movement occurs, a value of the previous frame reference flag is set at "1", and there is also a case where 3D Audio metadata is not transmitted for a somewhat long period of time. In such a case, when 3D Audio metadata to be referred to has not been obtained for some reason or other on the decoding device 51 side, 3D Audio can be reproduced by using externally obtained 3D Audio metadata.

It should be noted that in a case where externally obtained 3D Audio metadata is used, when 3D Audio metadata read from the DSE is subsequently used, if 3D Audio metadata suddenly changes from 3D Audio metadata obtained from the outside or the like to 3D Audio metadata read from the DSE, there is also a case where sense of discomfort occurs due to, for example, discontinuity in position of an audio object. Accordingly, for example, during some frames, interpolation processing is performed on the basis of externally obtained 3D Audio metadata that has been used last and 3D Audio metadata read from the DSE, and 3D Audio metadata obtained by the interpolation processing may be used to cause a position or the like of an audio object to smoothly change.

In addition, the externally obtained 3D Audio metadata may be obtained in any manner; for example, the externally obtained 3D Audio metadata may be generated by the 3D Audio metadata obtaining unit 63 on the basis of, for example, information obtained from the outside, and alternatively, may be obtained from a server through a network, or may be obtained from the encoding device 11 independently of the 3D AAC bit stream. Further, externally obtained 3D Audio metadata at each reproduction time is prepared beforehand for each content, and appropriate externally obtained 3D Audio metadata may be obtained according to the reproduction time of the content.

Moreover, 3D Audio metadata may be changed by a user's instruction or the like. As an example, with respect to content that is interactively shared and reproduced by a plurality of users, the content including, for example, a network type match game, 3D Audio metadata can be changed in consideration of not only user's operation in the decoding device 51, but also operation or the like of other users.

As described above, in a case where externally obtained 3D Audio metadata is obtained, identification information for identifying a type of audio data is required, the identification information indicating whether AAC audio element data that has been encoded by the AAC encoding method is channel-based AAC audio element data, object-based AAC audio element data, ambisonic-based AAC audio element data, or the like. In other words, configuration information indicating a configuration of the AAC audio element data is required. Such information must be obtained without decoding 3D Audio metadata.

Accordingly, in the present technology, as described with reference to FIG. 2, as information for identifying a type of audio data, in other words, as information indicating a configuration of AAC audio element data, 3D Audio component information is stored in a comment field of the PCE. It should be noted that information indicated by the 3D Audio component information is also included in the 3D Audio metadata.

By storing 3D Audio component information in the comment field of the PCE, the decoding device 51 is capable of obtaining 3D Audio component information in decoding processing based on the AAC standards in the AAC decoding unit 61. In addition, since the PCE is independently used even in a MPEG-4 File Format layer, the PCE has an advantage that when 3D Audio component information is stored in the PCE, 3D Audio component information can also be obtained from a system layer.

It should be noted that with respect to the comment field of the PCE as well, as with the case of the DSE, a decoding device that does not support the present technology is capable of skipping the number of bytes of the comment field recorded according to the AAC standards, and therefore the compatibility with the AAC standards can be maintained.

<About Transmission of Position Information on Two-Dimensional Plane>

Incidentally, with respect to the AAC standards, speaker arrangement information of each audio element (that is to say, each audio data) can be recorded in a PCE as position information of a position on a two-dimensional plane, the position being a front position (FRONT), a side position (SIDE), or a back position (BACK). In other words, speaker arrangement information indicating in which direction (front, back, or side) a speaker for reproducing audio data is arranged can be stored in PCE.

Meanwhile, in a 3D AAC bit stream, as position information of each audio object (that is to say, object-based audio data), 3D Audio metadata includes an angle indicating a position of an audio object in a plane direction, and an angle indicating a position in a height direction.

In the present technology, although there is an upper limit (limit) in the number of elements, speaker arrangement information that corresponds to a position of an audio object in accordance with an angle in a plane direction as much as possible may be described in the PCE.

Figure 8:
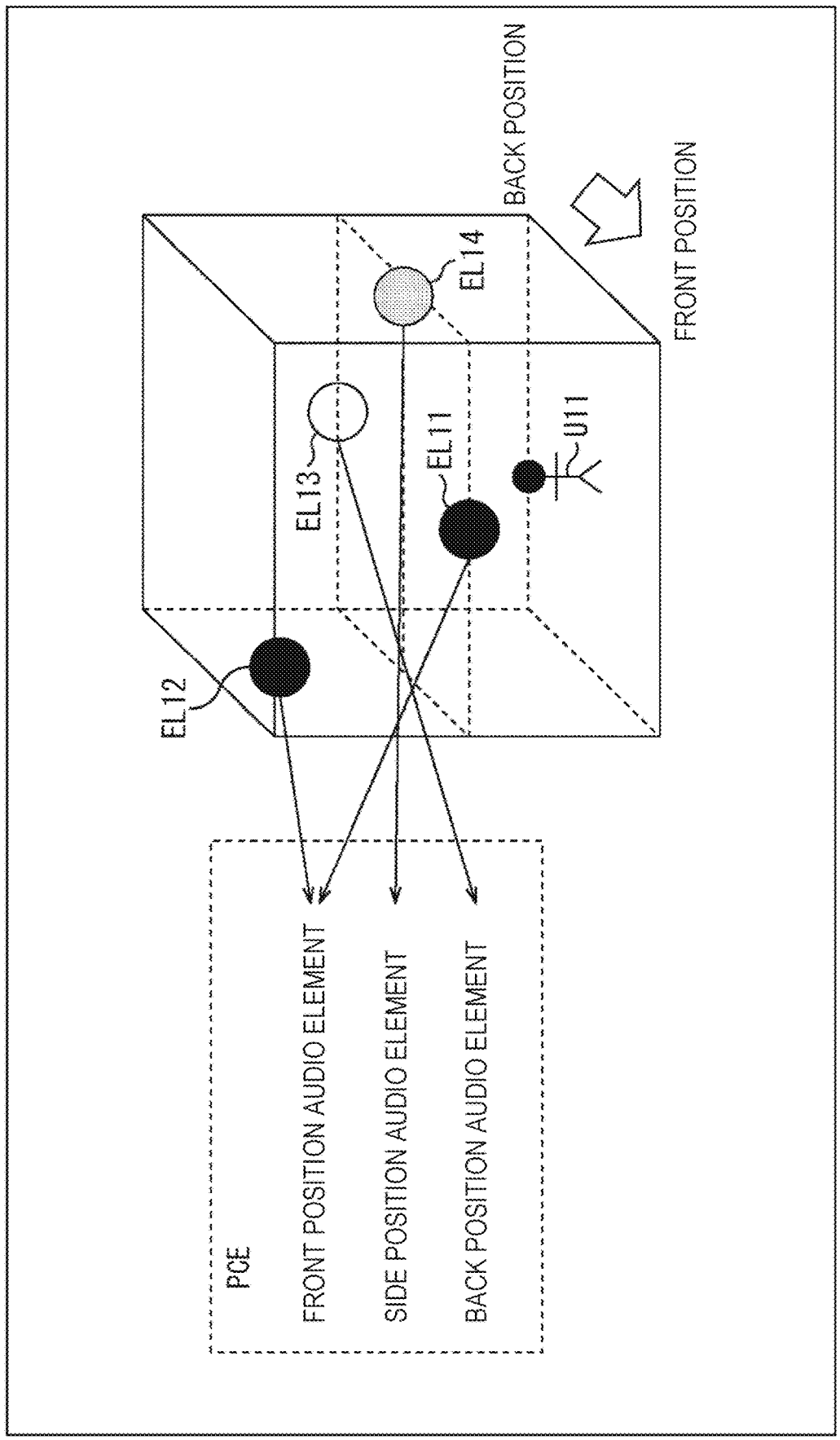
FIG. 8 is a diagram illustrating position information of an audio object.

Specifically, as shown in, for example, FIG. 8, it is assumed that there are four audio objects EL11 to EL14 as audio objects.

In FIG. 8, the near side is a front face direction of a user U11 who is a viewer/listener, in other words, a front direction, in the figure; and the far side is the back of the user U11 in the figure.

In this example, the audio object EL11 is located in the upper front of the user U11; and the audio object EL12 is located in the front upper right of the user U11. In addition, the audio object EL13 is located in the upper back of the user U11; and the audio object EL14 is located in the left side upper of the user U11.

In such a case, in the encoding device 11, the audio object EL11 and the audio object EL12 are handled as front position audio elements that are located forward. In addition, information indicating a front position is described in the PCE as speaker arrangement information of those audio objects.

In other words, positions of the audio object EL11 and the audio object EL12 in a three-dimensional space are mapped again at front positions on a two-dimensional plane. Subsequently, according to a result of the mapping, position information of those audio objects, in other words, information indicating the front positions is described in the PCE as speaker arrangement information.

In addition, the audio object EL13 is handled as a back position audio element that is located backward, and information indicating the back position that is a position of the audio object EL13 on the two-dimensional plane is described in the PCE as speaker arrangement information.

Similarly, the audio object EL14 is handled as a side position audio element that is located on the side, and information indicating the side position that is a position of the audio object EL14 on the two-dimensional plane is described in the PCE as speaker arrangement information.

Such speaker arrangement information is information indicating a speaker that should output audio data of the audio object, in other words, information related to speaker arrangement corresponding to the audio object. In other words, the speaker arrangement information is information indicating which channel audio data of each audio object uses, in other words, information indicating channel mapping of the audio object.

It can also be said that such speaker arrangement information is position information indicating a position of the audio object on the two-dimensional plane. Hereinafter, such speaker arrangement information is also referred to as "position information indicating a position of an audio object on a two-dimensional plane".

In this manner, by describing position information indicating a position of each audio object on the two-dimensional plane in the PCE, even if 3D Audio metadata cannot be used in the decoding device 51 for some reason, for example, because the decoding device 51 does not support 3D Audio, a position of each audio object on the two-dimensional plane can be identified.

Figure 9:
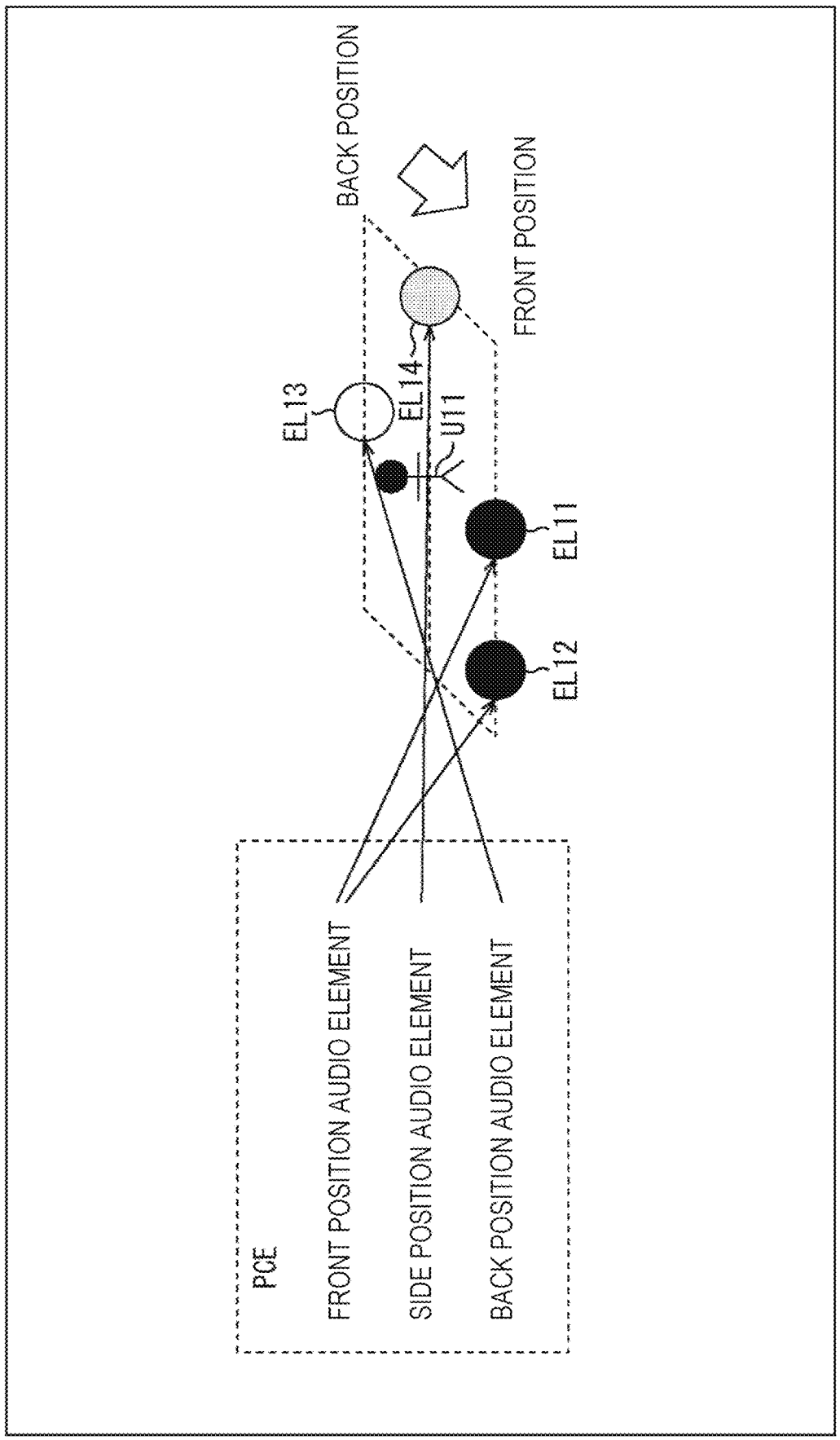
FIG. 9 is a diagram illustrating position information of an audio object.

Therefore, as shown in, for example, FIG. 9, a sound image of each audio object can be localized at a correct position on the two-dimensional plane from the position information indicating a position on the two-dimensional plane described in the PCE. It should be noted that in FIG. 9, identical reference numerals are used to denote parts corresponding to those shown in FIG. 8, and the description thereof will be omitted as appropriate.

In this example, by reading position information (speaker arrangement information) indicating positions of the audio objects EL11 to EL14 on the two-dimensional plane from the PCE, the decoding device 51 is capable of arranging respective audio objects at positions indicated by those pieces of position information.

In other words, although information related to a height direction cannot be obtained, 3D Audio channel mapping can be assigned to existing channel mapping as much as possible. Consequently, a sound based on object-based audio element data can be output from a speaker disposed at an approximate position of the audio object on the plane.

In the example shown in FIG. 9, heights of the audio objects EL11 to EL14 differ from the original heights, and are the same as the height of the head of the user U11. However, the audio object EL11 and the audio object EL12 are arranged in front of the user U11, the audio object EL13 is arranged behind the user U11, and the audio object EL14 is arranged on the left side of the user U11.

Thus, if position information indicating positions on the two-dimensional plane is used, sound images of sounds of the audio objects EL11 to EL14 can be localized at positions substantially in the same directions as the original ones.

<Explanation of Encoding Processing>

Subsequently, operations of the encoding device 11 and the decoding device 51 will be described.

Figure 10:
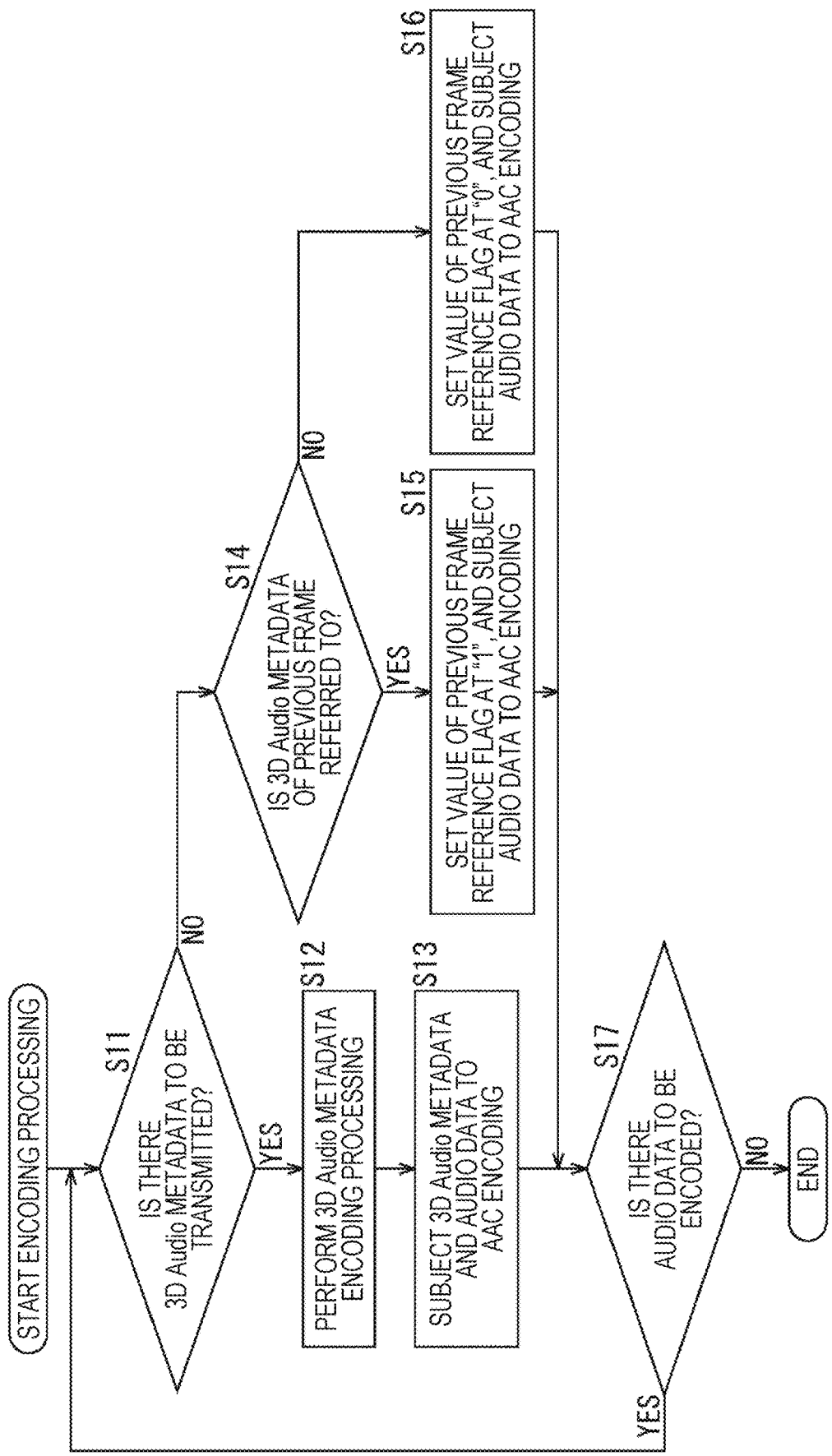
FIG. 10 is a flowchart illustrating encoding processing.

First of all, encoding processing by the encoding device 11 will be described with reference to a flowchart shown in FIG. 10. The encoding processing is started when audio data to be encoded is supplied.

In step S11, the 3D Audio metadata encoding unit 21 checks a current frame as a processing target to determine whether or not there is 3D Audio metadata to be transmitted.

For example, in a case where 3D Audio metadata has been supplied from the outside, it is determined that there is 3D Audio metadata to be transmitted. It should be noted that, for example, in a case where 3D Audio metadata does not change between the current frame as the processing target and the immediately preceding frame, when 3D Audio metadata of a previous frame is referred to, 3D Audio metadata of the current frame as the processing target is not supplied.

In a case where it has been determined, in step S11, that there is 3D Audio metadata to be transmitted, in step S12, the 3D Audio metadata encoding unit 21 performs 3D Audio metadata encoding processing of encoding 3D Audio metadata supplied from the outside. Subsequently, the 3D Audio metadata encoding unit 21 supplies the encoded 3D Audio metadata obtained by the 3D Audio metadata encoding processing to the AAC encoding unit 22.

In step S13, the AAC encoding unit 22 subjects the encoded 3D Audio metadata supplied from the 3D Audio metadata encoding unit 21, a previous frame reference flag, and audio data supplied from the outside to AAC encoding to generate AAC frame data for one frame.

In other words, the AAC encoding unit 22 stores the previous frame reference flag having a value of "0" in the DSE of the AAC frame data, and then, subsequent to the previous frame reference flag, stores encoded 3D Audio metadata in the DSE.

In addition, the AAC encoding unit 22 encodes the audio data for one frame supplied from the outside by the AAC encoding method, and stores the encoded audio data in a SCE, a CPE, a LFE, or the like of AAC frame data as AAC audio element data.

Moreover, the AAC encoding unit 22 also stores 3D Audio component information supplied from the outside, and position information (speaker arrangement information) indicating the position of the audio object on the two-dimensional plane in the PCE of the AAC frame data. Consequently, the AAC frame data having the configuration shown in, for example, FIG. 5 is obtained as a 3D AAC bit stream for one frame.

The AAC encoding unit 22 outputs (transmits) the 3D AAC bit stream for one frame obtained in this manner, and subsequently the process proceeds to step S17.

Meanwhile, in a case where it has been determined, in step S11, that there is no 3D Audio metadata to be transmitted, in step S14, the AAC encoding unit 22 determines whether or not 3D Audio metadata of a previous frame is referred to on the decoding side.

In a case where it has been determined, in step S14, that 3D Audio metadata of the previous frame is referred to, the process then proceeds to step S15.

In step S15, the AAC encoding unit 22 sets a value of the previous frame reference flag at "1", and subjects audio data supplied from the outside to AAC encoding.

In other words, the AAC encoding unit 22 stores the previous frame reference flag having a value of "1" in the DSE of the AAC frame data. In addition, the AAC encoding unit 22 encodes the audio data for one frame supplied from the outside by the AAC encoding method, and stores the encoded audio data in a SCE, a CPE, a LFE, or the like of AAC frame data as AAC audio element data.

Moreover, the AAC encoding unit 22 also stores 3D Audio component information supplied from the outside, and position information indicating the position of the audio object on the two-dimensional plane in the PCE of the AAC frame data.

The AAC encoding unit 22 outputs the AAC frame data obtained in this manner as a 3D AAC bit stream for one frame, and subsequently the process proceeds to step S17.

Meanwhile, in a case where it has been determined, in step S14, that 3D Audio metadata of the previous frame is not referred to, the process then proceeds to step S16.

In step S16, the AAC encoding unit 22 sets a value of the previous frame reference flag at "0", and subjects audio data supplied from the outside to AAC encoding.

In other words, the AAC encoding unit 22 stores the previous frame reference flag having a value of "0" in the DSE of the AAC frame data, and encodes the audio data for one frame supplied from the outside by the AAC encoding method to store the encoded audio data in the AAC frame data. It should be noted that hereinafter, audio data that has been encoded is also referred to as "encoded audio data".

Moreover, the AAC encoding unit 22 also stores 3D Audio component information supplied from the outside, and position information indicating the position of the audio object on the two-dimensional plane in the PCE of the AAC frame data.

The AAC encoding unit 22 outputs the AAC frame data obtained in this manner as a 3D AAC bit stream for one frame, and subsequently the process proceeds to step S17.

After the processing of step S13, the processing of step S15 or the processing of step S16 is performed, processing of step S17 is then performed.

In step S17, the encoding device 11 determines whether or not there is audio data to be encoded.

In a case where it has been determined, in step S17, that there is still audio data to be encoded, the process returns to step S11, and the above-described processing is repeatedly performed.

Meanwhile, in a case where it has been determined, in step S17, that there is no audio data to be encoded, in other words, audio data of content to be transmitted has been all encoded and output, the encoding processing ends.

As described above, the encoding device 11 stores the 3D Audio metadata in the DSE, and generates a 3D AAC bit stream. Performing the processing in such a manner enables the existing AAC standards to be extended, and 3D Audio reproduction to be performed by using the 3D Audio metadata on the decoding side. As the result, convenience can be enhanced.

In addition, by storing the previous frame reference flag, 3D Audio metadata of a temporally previous frame can be referred to on the decoding side, and therefore the encoding amount of the 3D AAC bit stream can be reduced by the amount of the 3D Audio metadata.

Moreover, by describing position information indicating a position of each audio object on the two-dimensional plane in the PCE of the 3D AAC bit stream, even if 3D Audio metadata cannot be obtained on the decoding side, a sound image of each audio object can be localized at a correct position on the two-dimensional plane. In other words, audio reproduction can be performed without spoiling realistic feeling.

<Explanation of Decoding Processing>

Next, decoding processing performed by the decoding device 51 will be described with reference to a flowchart shown in FIG. 11. This decoding processing is started when a 3D AAC bit stream transmitted by the encoding device 11 is received.

In step S41, the AAC decoding unit 61 subjects the received 3D AAC bit stream for one frame, in other words, AAC frame data, to AAC decoding processing that is decoding processing by a decoding method corresponding to the AAC encoding method.

In other words, the AAC decoding unit 61 reads 3D Audio component information from the PCE to supply the 3D Audio component information to an upper level control unit, or reads position information indicating a position of each audio object on the two-dimensional plane, that is to say, speaker arrangement information, from the PCE to supply the position information to the 3D Audio renderer 64 directly or through the upper level control unit.

In addition, the AAC decoding unit 61 decodes encoded audio data stored in AAC frame data, and supplies audio data, which is PCM data obtained as a result thereof, to the 3D Audio renderer 64.

In step S42, the AAC decoding unit 61 determines whether or not there is 3D Audio metadata in the DSE of the AAC frame data.

For example, in a case where encoded 3D Audio metadata is described subsequently to a value of the previous frame reference flag described at the top of the DSE, the AAC decoding unit 61 determines that there is 3D Audio metadata. In this case, the previous frame reference flag has a value of "0".

In a case where it has been determined, in step S42, that there is 3D Audio metadata, the AAC decoding unit 61 reads encoded 3D Audio metadata from the DSE to supply the encoded 3D Audio metadata to the 3D Audio metadata decoding unit 62, and subsequently the process proceeds to step S43.

In step S43, the 3D Audio metadata decoding unit 62 decodes the encoded 3D Audio metadata supplied from the AAC decoding unit 61, and supplies the 3D Audio metadata obtained as a result thereof to the 3D Audio renderer 64. After the 3D Audio metadata has been obtained in this manner, the process then proceeds to step S47.

In addition, in a case where it has been determined, in step S42, that there is no 3D Audio metadata, in step S44, the AAC decoding unit 61 determines whether or not a value of the previous frame reference flag described at the top of the DSE is "1".

In step S44, in a case where the value of the previous frame reference flag is not "1", in other words, in a case where although the value of the previous frame reference flag is "0", 3D Audio metadata could not have been obtained from the DSE, the process then proceeds to step S48.

Meanwhile, in a case where it has been determined, in step S44, that the value of the previous frame reference flag is "1", the process then proceeds to step S45. In this case, encoded 3D Audio metadata is not stored in the DSE.

In step S45, the AAC decoding unit 61 determines whether or not there is past 3D Audio metadata. In other words, with respect to a frame that is temporally before the current frame, which is the same content, that is to say, which is a processing target in the 3D AAC bit stream to be decoded, in a case where there is 3D Audio metadata read from the DSE, it is determined that there is past 3D Audio metadata.

In a case where it has been determined, in step S45, that there is past 3D Audio metadata, the AAC decoding unit 61 instructs the 3D Audio metadata decoding unit 62 to output 3D Audio metadata of a frame that is temporally nearest to the current frame, in other words, 3D Audio metadata that has been used last, among past frames read from the DSE, each having 3D Audio metadata, and subsequently the process proceeds to step S47.

In this case, the 3D Audio metadata decoding unit 62 supplies 3D Audio metadata used in the past frame to the 3D Audio renderer 64 according to the instruction of the AAC decoding unit 61.

Specifically, in the example shown in, for example, FIG. 6, if a frame (N+1) is a current frame, the 3D Audio metadata decoding unit 62 supplies 3D Audio metadata (N) of a frame N to the 3D Audio renderer 64.

Meanwhile, in a case where it has been determined, in step S45, that there is no past 3D Audio metadata, 3D Audio metadata used in the current frame could not have been obtained from the 3D AAC bit stream for some reason or other, and accordingly the process then proceeds to step S46.

In step S46, the AAC decoding unit 61 determines whether or not there is 3D Audio metadata obtained from a source other than the 3D AAC bit stream. In other words, a determination is made as to whether or not there is externally obtained 3D Audio metadata obtained by the 3D Audio metadata obtaining unit 63.

In a case where it has been determined, in step S46, that there is no obtained 3D Audio metadata, the process then proceeds to step S48.

In addition, in a case where it has been determined, in step S46, that there is obtained 3D Audio metadata, the AAC decoding unit 61 instructs the 3D Audio metadata obtaining unit 63 to output the obtained 3D Audio metadata, and subsequently the process proceeds to step S47.

In this case, the 3D Audio metadata obtaining unit 63 supplies the externally obtained 3D Audio metadata to the 3D Audio renderer 64, the externally obtained 3D Audio metadata having been obtained from the outside, or the 3D Audio metadata obtaining unit 63 itself having generated the externally obtained 3D Audio metadata.

In a case where the processing of step S43 has been performed, in a case where it has been determined, in step S45, that there is past 3D Audio metadata, or in a case where it has been determined, in step S46, that there is obtained 3D Audio metadata, processing of step S47 is then performed.

In step S47, the 3D Audio renderer 64 performs rendering on the basis of the 3D Audio metadata supplied from the 3D Audio metadata decoding unit 62 or the 3D Audio metadata obtaining unit 63, and the audio data supplied from the AAC decoding unit 61.

Subsequently, the 3D Audio renderer 64 outputs reproduction data of a current frame, which has been obtained by rendering so as to realize 3D Audio reproduction, and then the process proceeds to step S49.

In addition, in a case where it has been determined, in step S44, that the value of the previous frame reference flag is not "1", or in a case where it has been determined, in step S46, that there is no obtained 3D Audio metadata, processing of step S48 is performed.

In other words, in step S48, the 3D Audio renderer 64 performs rendering defined by the ordinary AAC standards on the basis of the audio data supplied from the AAC decoding unit 61, and outputs reproduction data obtained as a result thereof.

In this case, on the basis of position information (speaker arrangement information) indicating a position of each audio object on the two-dimensional plane read from the PCE, the 3D Audio renderer 64 generates audio data of each channel as reproduction data, as appropriate, in such a manner that a sound image of each audio object is localized at a position on the two-dimensional plane indicated by the position information. Consequently, even if 3D Audio metadata could not have been obtained, with the result that sound image lateralization control of audio object (sound source) in height direction cannot be performed, a sound image of each audio object can be localized at a correct position on the two-dimensional plane.

In this manner, after the reproduction data of the current frame is output, the process then proceeds to step S49.

After the processing of step S47 or the processing of step S48 is performed, when reproduction data for one frame is output, in step S49, the AAC decoding unit 61 determines whether or not there is a 3D AAC bit stream to be decoded.

For example, in step S49, in a case where the received 3D AAC bit stream has not yet been all decoded, it is determined that there is a 3D AAC bit stream to be decoded.

In a case where it has been determined, in step S49, that there is a 3D AAC bit stream to be decoded, the process returns to step S41, and the above-described processing is repeatedly performed.

Meanwhile, in a case where it has been determined, in step S49, that there is no 3D AAC bit stream to be decoded, the decoding processing ends.

As described above, the decoding device 51 reads 3D Audio metadata from the DSE, and performs rendering by using the read 3D Audio metadata. Performing the processing in such a manner enables 3D Audio reproduction to be performed with the existing AAC standards extended, and consequently convenience can be enhanced.

Moreover, since position information indicating a position of each audio object on the two-dimensional plane is described in the PCE of the 3D AAC bit stream, even if 3D Audio metadata cannot be obtained, a sound image of each audio object can be localized at a correct position on the two-dimensional plane. In other words, audio reproduction can be performed without spoiling realistic feeling.

Second Embodiment

<About Division Transmission of 3D Audio Metadata>

Incidentally, with the increase in the number of audio objects, in other words, with the increase in the number of object audios, the data amount (the encoding amount) of 3D Audio metadata increases.

Therefore, if the data amount of 3D Audio metadata increases, there is a case where the size (data amount) of 3D Audio metadata exceeds the upper limit size of the DSE defined in the AAC standards. In addition, there is also a case where the number of DSEs required for one frame to store 3D Audio metadata exceeds an upper limit of the number of DSEs defined in the AAC standards.

Accordingly, in the present technology, in a case where the data amount of 3D Audio metadata is large, as an alternative to transmitting 3D Audio metadata of each of a plurality of frames, those pieces of 3D Audio metadata are thinned out as appropriate, and a representative value of the 3D Audio metadata is transmitted with the representative value stored in the DSE of the plurality of frames. In other words, a representative value is transmitted over a plurality of frames.

Figure 12:
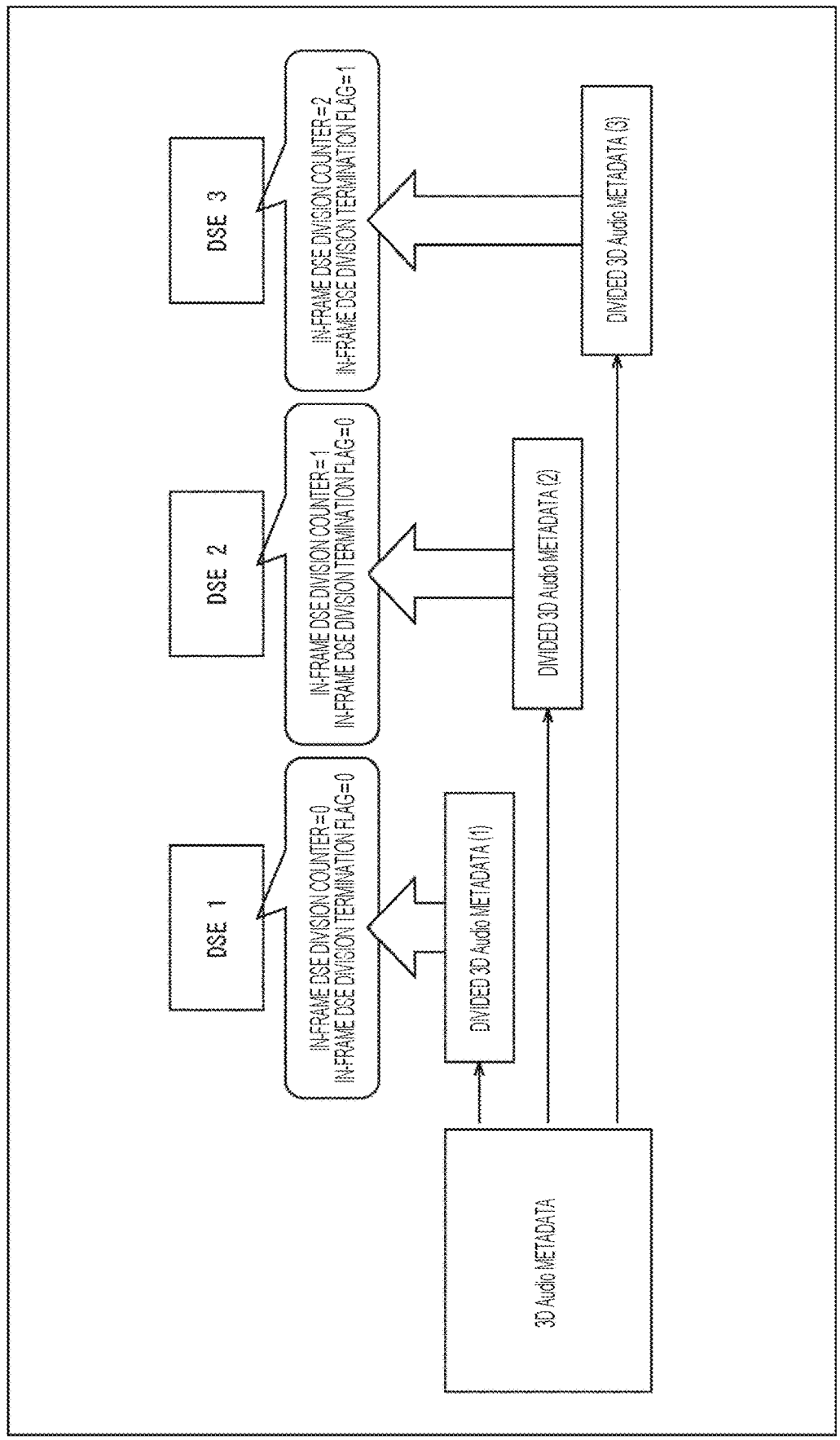
FIG. 12 is a diagram illustrating division transmission of 3D Audio metadata.

As shown in, for example, FIG. 12, it is assumed that three DSEs can be provided in AAC frame data for one frame. It should be noted that in FIG. 12, quadrangles having respective characters "DSE 1" to "DSE 3" illustrated therein represent the respective DSEs provided in the AAC frame data for one frame. Hereinafter, those DSEs are also referred to as "DSE 1 to DSE 3".

In this example, the data amount of 3D Audio metadata for one frame is large, and therefore the 3D Audio metadata is in a state in which the 3D Audio metadata cannot be entirely stored in the first DSE 1.

In such a case, the encoding device 11 divides the 3D Audio metadata into three pieces of data. Here, the three pieces of data obtained by dividing the 3D Audio metadata are designated as divided 3D Audio metadata (1) to divided 3D Audio metadata (3). Moreover, hereinafter, in a case where it is not particularly necessary to distinguish pieces of data obtained by dividing 3D Audio metadata, the pieces of data are also referred to as "divided 3D Audio metadata".

The encoding device 11 stores the divided 3D Audio metadata (1) to the divided 3D Audio metadata (3) obtained by division in the DSE 1 to the DSE 3 respectively.

At this point, in order to inform that 3D Audio metadata has been divided, and in order to enable association of each piece of divided 3D Audio metadata with a data number counted from the top to be identified, the encoding device 11 generates an in-frame DSE division counter, and an in-frame DSE division termination flag.

The in-frame DSE division counter is information indicating what number the DSE that stores divided 3D Audio metadata is in AAC frame data for one frame.

In other words, it can also be said that the in-frame DSE division counter is information indicating what number each piece of divided 3D Audio metadata corresponds to in the pieces of divided 3D Audio metadata stored in the DSEs of the AAC frame for one frame.

For example, divided 3D Audio metadata stored in a DSE, the value of the in-frame DSE division counter of which is "i−1" (1□i), becomes the i-th divided 3D Audio metadata from the top, which is stored in the DSEs of the AAC frame for one frame.

In addition, the in-frame DSE division termination flag is flag information indicating whether or not a DSE is the last DSE that stores divided 3D Audio metadata among DSEs that are arranged in order in AAC frame data for one frame.

Specifically, in a case where a value of the in-frame DSE division termination flag is "0", it is indicated that the DSE is not the last DSE in which divided 3D Audio metadata is stored.

Meanwhile, in a case where the value of the in-frame DSE division termination flag is "1", it is indicated that the DSE is the last DSE that stores divided 3D Audio metadata in the AAC frame data.

The encoding device 11 stores, in each DSE, not only divided 3D Audio metadata, but also the in-frame DSE division counter and the in-frame DSE division termination flag.

In other words, in this example, the first DSE 1 stores: the in-frame DSE division counter having a value of "0", which indicates that divided 3D Audio metadata is the first divided 3D Audio metadata; the in-frame DSE division termination flag having a value of "0", which indicates that the DSE is not the last DSE; and divided 3D Audio metadata (1).

In addition, the second DSE 2 stores: the in-frame DSE division counter having a value of "1", which indicates that divided 3D Audio metadata is the second divided 3D Audio metadata; the in-frame DSE division termination flag having a value of "0", which indicates that the DSE is not the last DSE; and divided 3D Audio metadata (2). Moreover, the third DSE 3 stores: the in-frame DSE division counter having a value of "2", which indicates that divided 3D Audio metadata is the third divided 3D Audio metadata; the in-frame DSE division termination flag having a value of "1", which indicates that the DSE is the last DSE; and divided 3D Audio metadata (3).

In this manner, by storing the in-frame DSE division counter and the in-frame DSE division termination flag, pieces of divided 3D Audio metadata can be read on the decoding side to correctly combine the pieces of divided 3D Audio metadata, and consequently original 3D Audio metadata can be obtained.

Figure 13:
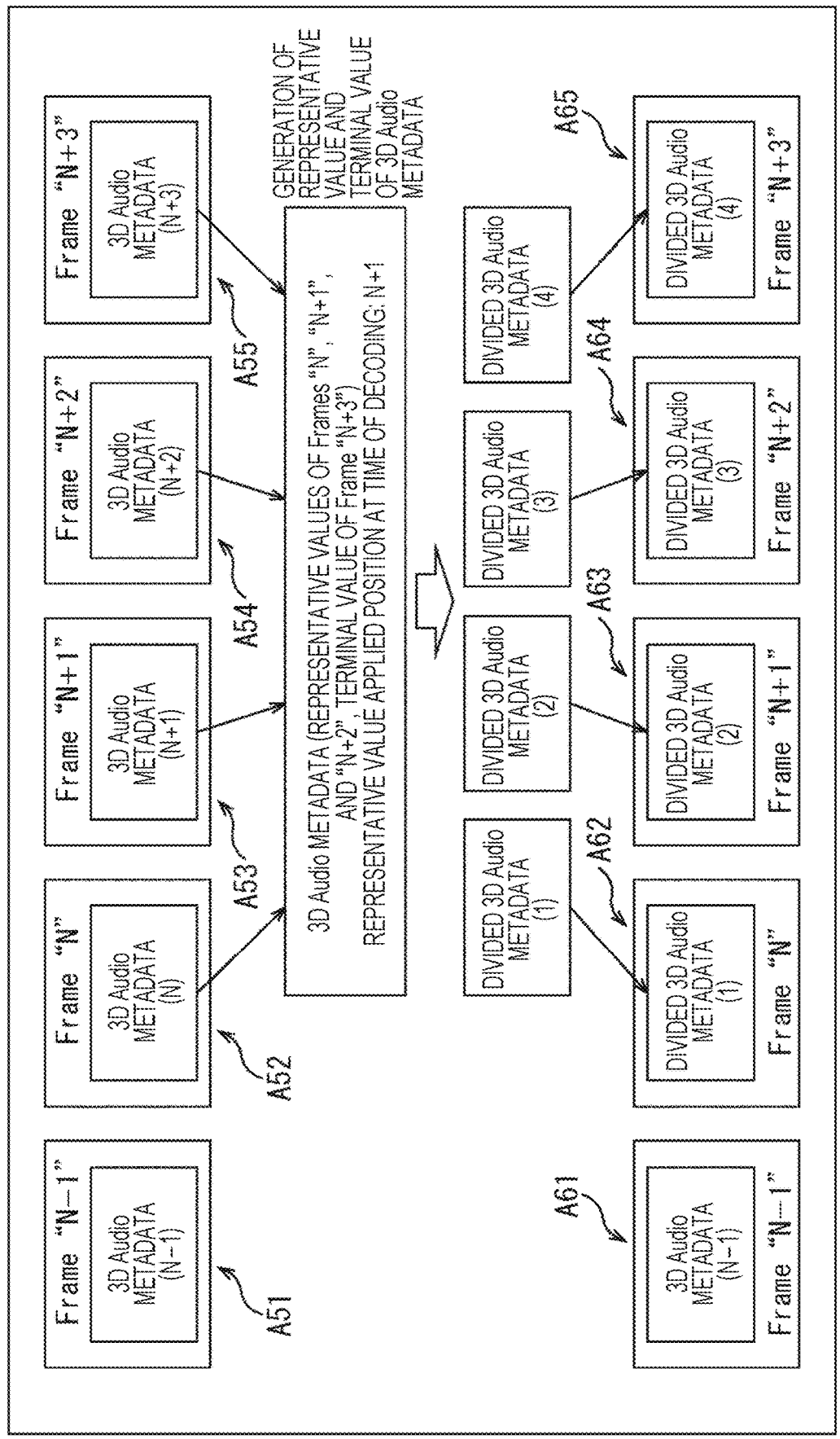
FIG. 13 is a diagram illustrating division transmission of 3D Audio metadata.

In addition, in a case where 3D Audio metadata cannot be entirely stored in AAC frame data for one frame, as shown in, for example, FIG. 13, the encoding device 11 divides a representative value as 3D Audio metadata into pieces of AAC frame data for a plurality of frames, and stores the pieces of divided AAC frame data. It should be noted that here, in order to simplify the explanation, it is assumed that one DSE is provided per frame.

In FIG. 13, quadrangles indicated by respective arrows A51 to A55 represent respective pieces of AAC frame data of frames (N−1) to (N+3). In addition, here, 3D Audio metadata of an original frame (i) (however, N−1□i□N+3) is also referred to as "3D Audio metadata (i)".

In this example, 3D Audio metadata (N−1) to 3D Audio metadata (N+3) were originally prepared for frames (N−1) to (N+3). However, since the data amount of 3D Audio metadata (N) to 3D Audio metadata (N+3) is large, those pieces of 3D Audio metadata cannot be stored as they are in the corresponding DSE for one frame.

Accordingly, the encoding device 11 newly generates one piece of 3D Audio metadata in order to obtain 3D Audio metadata for frames (N) to (N+3). In other words, representative 3D Audio metadata is selected by thinning out some pieces of 3D Audio metadata.

Specifically, for example, the encoding device 11 determines one piece of 3D Audio metadata as a representative value that represents 3D Audio metadata (N) to 3D Audio metadata (N+2).

Here, the representative value may be, for example, any one piece of 3D Audio metadata selected from among 3D Audio metadata (N) to 3D Audio metadata (N+2), or an average value of 3D Audio metadata (N) to 3D Audio metadata (N+2) may be used as the representative value.

In this case, paying attention to, for example, one audio object, for example, an average value of position information of frames (N) to (N+2) of an audio object as 3D Audio metadata is used as a representative value as 3D Audio metadata of the audio object.

Besides the above, for example, it is assumed that there is a plurality of audio objects, one specific audio object among the plurality of audio objects is most important, and movement in the frame (N+1) of the specific audio object is most important.

In such a case, for example, position information as 3D Audio metadata (N+1) of the specific audio object is used as a representative value of the specific audio object. In addition, with respect to all the other audio objects as well, respective pieces of position information as 3D Audio metadata (N+1) of those audio objects are used as respective representative values of those audio objects.

Moreover, for example, it is assumed that there is a plurality of audio objects, one specific audio object among the plurality of audio objects is most important, and movement in the frame (N+1) of the specific audio object is most important. In such a case, for example, position information as 3D Audio metadata (N+1) of the specific audio object may be used as a representative value of all audio objects.

Moreover, as another example, an average value of position information of respective frames of the plurality of audio objects, each respective frame having the most important movement, is determined, and the obtained average value may be used as a representative value shared by all audio objects.

After the representative value of 3D Audio metadata (N) to 3D Audio metadata (N+2) is determined, the encoding device 11 generates, as a terminal value, 3D Audio metadata of a terminal frame of a time period (hereinafter, also referred to as "division transmission time period") that includes a plurality of frames into which one piece of 3D Audio metadata is divided for transmission.

For example, in this example, a time period from the frame (N) to the frame (N+3) is a division transmission time period, and therefore a terminal frame of the division transmission time period is the frame (N+3). Accordingly, the encoding device 11 determines a terminal value in some way, for example, by using 3D Audio metadata (N+3) as the terminal value as it is.

Moreover, the encoding device 11 determines, as a representative-value-applied frame, a frame to which the representative value is applied, among frames in the division transmission time period, and generates an applied frame index indicating the representative-value-applied frame. Here, the representative-value-applied frame is a frame, the representative value of which is used as 3D Audio metadata as it is on the decoding side.

For example, in the example of FIG. 13, in a case where the representative-value-applied frame is the frame (N+1), the encoding device 11 generates information indicating the frame (N+1) as an applied frame index.

Specifically, for example, in a case where the representative-value-applied frame is the i-th frame (1□i) from the top in the division transmission time period, a value of the applied frame index is set at "i−1". Therefore, in the example shown in FIG. 13, the second frame (N+1) from the top of the division transmission time period is the representative-value-applied frame, and therefore a value of the applied frame index is "1".

After the representative value and terminal value of the division transmission time period, and the applied frame index are obtained as described above, the encoding device 11 uses the representative value and the terminal value as 3D Audio metadata of the division transmission time period, and divides the 3D Audio metadata.

In other words, the encoding device 11 divides the 3D Audio metadata of the division transmission time period into pieces of divided 3D Audio metadata, the number of which is equivalent to the number of frames included in the division transmission time period.

In this example, the number of frames constituting the division transmission time period is four, and therefore the 3D Audio metadata is divided into four pieces of divided 3D Audio metadata indicated by characters "divided 3D Audio metadata (1)" to "divided 3D Audio metadata (4)".

It should be noted that hereinafter, the divided 3D Audio metadata indicated by the characters "divided 3D Audio metadata (1)" to "divided 3D Audio metadata (4)" is also referred to as "divided 3D Audio metadata (1) to divided 3D Audio metadata (4)".

After the divided 3D Audio metadata is obtained, the encoding device 11 stores those pieces of divided 3D Audio metadata in the DSE of AAC frame data of each frame, and outputs the divided 3D Audio metadata.

Here, quadrangles indicated by respective arrows A61 to A65 represent respective pieces of AAC frame data of frames (N−1) to (N+3) that are actually output from the encoding device 11.

In this example, in AAC frame data of the frame (N−1), 3D Audio metadata (N−1) that is not divided is stored as it is in the DSE.

Meanwhile, in AAC frame data of the frame (N), the divided 3D Audio metadata (1) and the applied frame index are stored in the DSE; and in AAC frame data of the frame (N+1), the divided 3D Audio metadata (2) is stored in the DSE. In addition, in AAC frame data of the frame (N+2), the divided 3D Audio metadata (3) is stored in the DSE; and in AAC frame data of the frame (N+3), the divided 3D Audio metadata (4) is stored in the DSE.

It should be noted that the applied frame index may be stored in the DSE of any frame so long as the DSE belongs to a frame in the division transmission time period.

Figure 14:
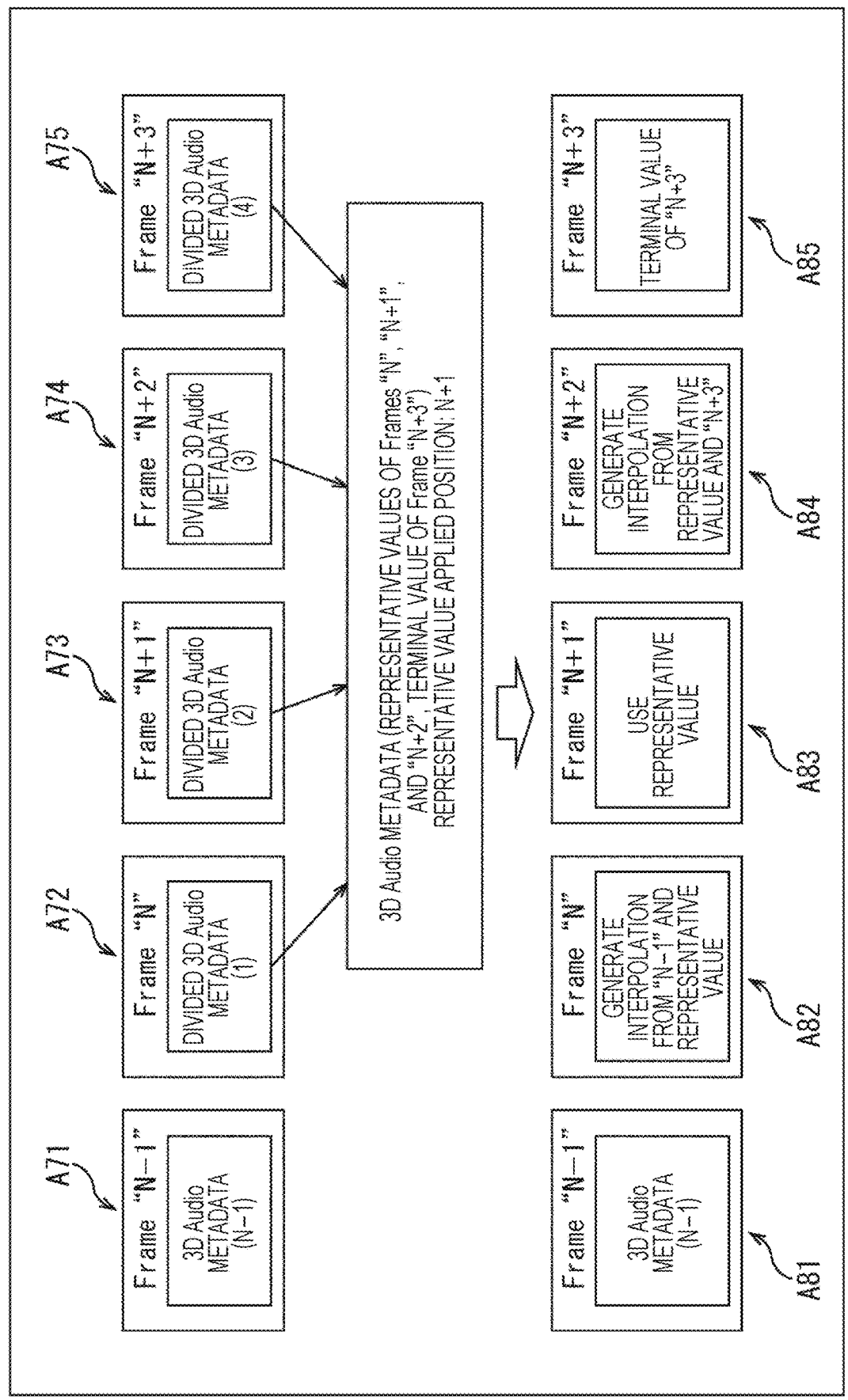
FIG. 14 is a diagram illustrating division transmission of 3D Audio metadata.

Moreover, the decoding device 51 that has received such a 3D AAC bit stream performs decoding as shown in, for example, FIG. 14. It should be noted that in FIG. 14, with respect to parts corresponding to those shown in FIG. 13, the description thereof will be omitted.

In the example shown in FIG. 14, the decoding device 51 receives a 3D AAC bit stream constituted of pieces of AAC frame data indicated by respective arrows A71 to A75.

Here, the pieces of AAC frame data of frames shown by the respective arrows A71 to A75 correspond to pieces of AAC frame data of frames shown by the respective arrows A61 to A65 in FIG. 13.

With respect to the frame (N−1), the 3D Audio metadata of which is not divided, the decoding device 51 reads 3D Audio metadata (N−1) from AAC frame data of the frame (N−1) as indicated by an arrow A81. Subsequently, the decoding device 51 performs rendering on the basis of the read 3D Audio metadata (N−1).

Meanwhile, with respect to the frames (N) to (N+3), in which 3D Audio metadata has been divided, pieces of 3D Audio metadata of those frames are generated on the basis of divided 3D Audio metadata (1) to divided 3D Audio metadata (4).

In other words, the AAC decoding unit 61 of the decoding device 51 reads, from the respective DSEs of frames (N) to (N+3), the respective divided 3D Audio metadata (1) to (4) that have been obtained by dividing 3D Audio metadata for those frames. Subsequently, the AAC decoding unit 61 combines those pieces of read divided 3D Audio metadata (1) to (4) into one encoded 3D Audio metadata.

Subsequently, the decoding device 51 obtains the representative value and the terminal value by decoding the obtained encoded 3D Audio metadata, and reads the applied frame index from the DSE. Subsequently, the decoding device 51 generates 3D Audio metadata of frames in the division transmission time period by performing interpolation processing on the basis of the representative value, the terminal value and the applied frame index that have been obtained.

Specifically, as indicated by an arrow A83, the decoding device 51 uses the representative value as 3D Audio metadata of the frame (N+1) indicated by the applied frame index.

In addition, as indicated by an arrow A82, the decoding device 51 generates 3D Audio metadata (N) of the frame (N) by interpolation processing on the basis of 3D Audio metadata (N−1) of the frame (N−1), and the representative value that is 3D Audio metadata of the frame (N+1).

Moreover, as indicated by an arrow A85, the decoding device 51 uses the terminal value as 3D Audio metadata of the frame (N+3) as it is. As indicated by an arrow A84, the decoding device 51 generates 3D Audio metadata (N+2) of the frame (N+2) by interpolation processing on the basis of the representative value that is 3D Audio metadata of the frame (N+1), and the terminal value that is 3D Audio metadata of the frame (N+3).

In the frames (N) to (N+3), the decoding device 51 performs rendering by using 3D Audio metadata (N) to (N+3) obtained in this manner.

As described above, the decoding device 51 reads pieces of divided 3D Audio metadata that have been dividedly stored in the plurality of frames, and obtains pieces of 3D Audio metadata of respective frames of the division transmission time period. Performing the processing in such a manner enables 3D Audio metadata to be efficiently transmitted, leading to an improvement in convenience, and 3D Audio reproduction with realistic feeling to be realized.

It should be noted that here, the example in which 3D Audio metadata of the division transmission time period includes the terminal value has been explained. However, the 3D Audio metadata of the division transmission time period may be adapted not to include the terminal value. In such a case, 3D Audio metadata of a frame immediately after the terminal of the division transmission time period is only required to be used as the terminal value.

<Example of DSE Syntax>

As described above, in AAC frame data for one frame, in a case where 3D Audio metadata is divided into a plurality of pieces of divided 3D Audio metadata, and the pieces of divided 3D Audio metadata are stored in a plurality of DSEs, it is necessary to enable the decoding side to recognize the above case.

Therefore, in-frame DSE division information that is information related to division of 3D Audio metadata in a frame, in other words, in AAC frame data, is described in the DSE on the encoded side, the in-frame DSE division information including the in-frame DSE division counter and the in-frame DSE division termination flag described above.

Syntax of such in-frame DSE division information is defined as shown in, for example, FIG. 15. In the example shown in FIG. 15, characters "dse_div_info( )" represent a function in which in-frame DSE division information is stored, and this function exists in 3D Audio metadata of each frame. Here, in-frame DSE division information exists on a DSE basis.

In addition, the in-frame DSE division information includes: an in-frame DSE division counter indicated by characters "dse_div_cnt"; and an in-frame DSE division termination flag indicated by characters "dse_div_terminate".

As described above, the in-frame DSE division counter is counter information starting from 0, the counter information indicating what number the corresponding DSE is among DSEs each storing divided 3D Audio metadata in the same frame. Here, the in-frame DSE division counter is 3-bit information, and therefore 3D Audio metadata or divided 3D Audio metadata can be divided into up to eight pieces of divided 3D Audio metadata in one frame. In other words, eight DSEs can be provided at the maximum.

In addition, when the in-frame DSE division termination flag has a value of "0", the in-frame DSE division termination flag indicates that the corresponding DSE is not the last DSE storing divided 3D Audio metadata in the frame. Meanwhile, when the in-frame DSE division termination flag has a value of "1", the in-frame DSE division termination flag indicates that the corresponding DSE is the last DSE storing divided 3D Audio metadata in the frame.

Moreover, in a case where pieces of divided 3D Audio metadata obtained by dividing one piece of 3D Audio metadata are stored in DSEs of a plurality of frames, it is necessary to enable the decoding side to recognize the above case.

Therefore, on the encoding side, as is the case with the in-frame DSE division information, frame division information that is information related to division of 3D Audio metadata among frames, in other words, division of 3D Audio metadata for a plurality of frames is described in the DSE.

Syntax of such frame division information is defined as shown in, for example, FIG. 16.

In the example shown in FIG. 16, characters "frame_div_info( )" represent a function in which frame division information is stored, and this function exists in 3D Audio metadata of each frame. Here, one piece of frame division information exists for one frame.

The frame division information includes frame division mode information indicated by characters "frm_div_mode".

This frame division mode information is information indicating whether or not a mode is a frame division mode in which one piece of 3D Audio metadata is transmitted over a plurality of frames, in other words, one piece of 3D Audio metadata is dividedly stored in DSEs of a plurality of frames.

Here, in a case where frame division mode information has a value of "0", the frame division mode information indicates that the mode is not the frame division mode, in other words, 3D Audio metadata for one frame is stored in a DSE for one frame.

Meanwhile, in a case where frame division mode information has a value of "1", the frame division mode information indicates that the mode is the frame division mode, in other words, one piece of 3D Audio metadata is divided into pieces, which are stored in DSEs of a plurality of frames.

In addition, in a case where frame division mode information has a value of "1", the frame division information further stores: a frame division counter indicated by characters "frm_div_cnt"; and a frame division termination flag indicated by characters "frm_div_terminate".

The frame division counter is counter information starting from 0, the frame division counter indicating what number the corresponding frame is counted from the top among frames that constitute the division transmission time period. Here, the frame division counter is 3-bit information, and therefore the division transmission time period can be provided as a time period having eight frames at the maximum. In other words, one piece of 3D Audio metadata can be transmitted over eight frames.

In addition, when the frame division termination flag has a value of "0", the frame division termination flag indicates that the corresponding frame is not the last frame in the division transmission time period. Meanwhile, when the frame division termination flag has a value of "1", the frame division termination flag indicates that the corresponding frame is the last (terminal) frame in the division transmission time period.

Moreover, in a case where the frame division counter has a value of "0", the frame division information also stores an applied frame index indicated by characters "apply_frm_Index". In other words, the applied frame index is stored in the DSE of the first (top) frame in the division transmission time period.

This applied frame index is information indicating a representative-value-applied frame, and here, a value of the frame division counter of the representative-value-applied frame is a value of the applied frame index.

Incidentally, when the number of division frames, that is to say, the number of frames that constitute the division transmission time period, is F, in a case where a value of the applied frame index is smaller than F by one (F−1), only a representative value or a terminal value is included as 3D Audio metadata.

In other words, in a case where a frame indicated by the applied frame index is the terminal frame of the division transmission time period, the terminal value becomes the representative value, and therefore only the representative value or the terminal value is transmitted as 3D Audio metadata.

AAC frame data for one frame stores the in-frame DSE division information and the frame division information described above. Hereinafter, information that includes the in-frame DSE division information and the frame division information is also referred to as "division information". However, division information is stored in each DSE of AAC frame data. Although the division information is not always required to include frame division information, the division information is adapted to always include in-frame DSE division information.

In such a case, syntax of division information stored in AAC frame data is as shown in, for example, FIG. 17.

In the example shown in FIG. 17, characters "div_info( )" represent a function in which division information is stored, and this function exists in 3D Audio metadata of each frame.

In addition, here, in-frame DSE division information indicated by characters "dse_div_info( )" is included as the division information. Moreover, in a case where a value of the in-frame DSE division counter (dse_div_cnt) included in the in-frame DSE division information is "0", frame division information indicated by characters "frame_div_info( )" is further included as division information.

In other words, the first (top) DSE in AAC frame data includes the in-frame DSE division information and the frame division information as division information; and the second and later DSEs in the AAC frame data include only the in-frame DSE division information as division information.

Figure 18:
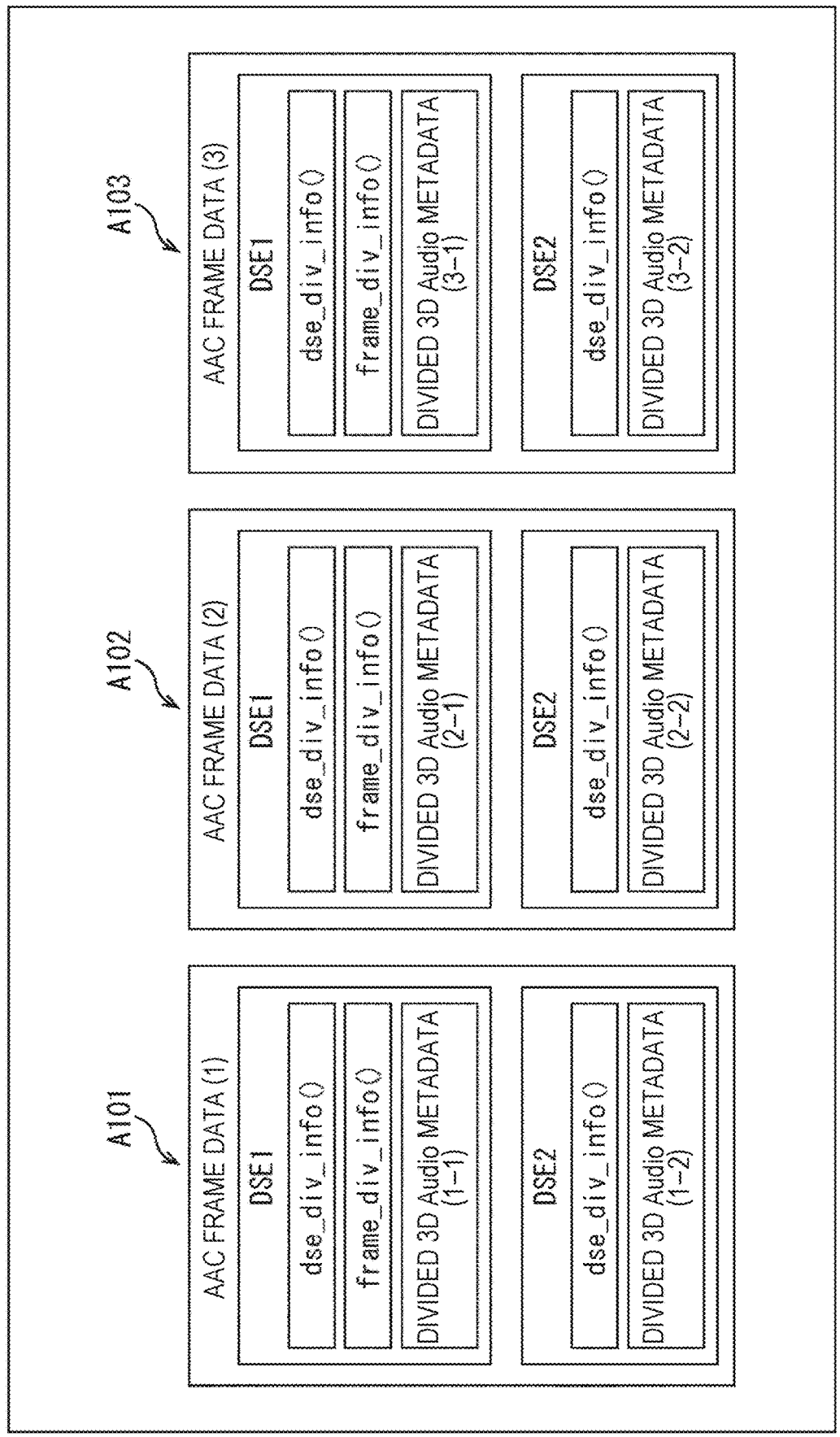
FIG. 18 is a diagram illustrating dividing of 3D Audio metadata into a plurality of frames.

As shown in FIG. 17, in a case where division information is stored in AAC frame data, when one piece of 3D Audio metadata is transmitted over three frames, the data is processed as shown in, for example, FIG. 18.

In an example shown in FIG. 18, one piece of 3D Audio metadata is stored in AAC frame data (1) to (3) that are pieces of AAC frame data indicated by arrows A101 to A103.

In other words, the first AAC frame data (1) is provided with DSE1 that is the first DSE, and DSE2 that is the second DSE.

The DSE1 of this AAC frame data (1) stores in-frame DSE division information (dse_div_info( )) and frame division information (frame_div_info( )), which are division information, and divided 3D Audio metadata (1-1) that is divided 3D Audio metadata.

In this case, in the in-frame DSE division information in the DSE1 of the AAC frame data (1), a value of the in-frame DSE division counter (dse_div_cnt) is "0", and a value of the in-frame DSE division termination flag (dse_div_terminate) is "0".

In addition, in the frame division information in the DSE1 of the AAC frame data (1), a value of the frame division mode information (frm_div_mode) is "1", a value of the frame division counter (frm_div_cnt) is "0", a value of the frame division termination flag (frm_div_terminate) is "0", and an applied frame index having an appropriate value is included.

Moreover, the DSE2 of AAC frame data (1) stores in-frame DSE division information (dse_div_info( )) as division information, and divided 3D Audio metadata (1-2) that is divided 3D Audio metadata.

In this case, in the in-frame DSE division information in the DSE2 of the AAC frame data (1), a value of the in-frame DSE division counter (dse_div_cnt) is "1", and a value of the in-frame DSE division termination flag (dse_div_terminate) is "1".

Similarly, the second AAC frame data (2) is provided with the first DSE1, and the second DSE2.

The DSE1 of the AAC frame data (2) stores in-frame DSE division information (dse_div_info( )) and frame division information (frame_div_info( )), which are division information, and divided 3D Audio metadata (2-1) that is divided 3D Audio metadata.

In this case, in the in-frame DSE division information in the DSE1 of the AAC frame data (2), a value of the in-frame DSE division counter (dse_div_cnt) is "0", and a value of the in-frame DSE division termination flag (dse_div_terminate) is "0".

In addition, in the frame division information in the DSE1 of the AAC frame data (2), a value of the frame division mode information (frm_div_mode) is "1", a value of the frame division counter (frm_div_cnt) is "1", and a value of the frame division termination flag (frm_div_terminate) is "0". It should be noted that this frame division information does not include an applied frame index.

Moreover, the DSE2 of AAC frame data (2) stores in-frame DSE division information (dse_div_info( )) as division information, and divided 3D Audio metadata (2-2) that is divided 3D Audio metadata.

In this case, in the in-frame DSE division information in the DSE2 of the AAC frame data (2), a value of the in-frame DSE division counter (dse_div_cnt) is "1", and a value of the in-frame DSE division termination flag (dse_div_terminate) is "1".

Moreover, the third AAC frame data (3) is provided with the first DSE1, and the second DSE2.

The DSE1 of the AAC frame data (3) stores in-frame DSE division information (dse_div_info( )) and frame division information (frame_div_info( )), which are division information, and divided 3D Audio metadata (3-1) that is divided 3D Audio metadata.

In this case, in the in-frame DSE division information in the DSE1 of the AAC frame data (3), a value of the in-frame DSE division counter (dse_div_cnt) is "0", and a value of the in-frame DSE division termination flag (dse_div_terminate) is "0".

In addition, in the frame division information in the DSE1 of the AAC frame data (3), a value of the frame division mode information (frm_div_mode) is "1", a value of the frame division counter (frm_div_cnt) is "2", and a value of the frame division termination flag (frm_div_terminate) is "1". It should be noted that this frame division information does not include an applied frame index.

Moreover, the DSE2 of AAC frame data (3) stores in-frame DSE division information (dse_div_info( )) as division information, and divided 3D Audio metadata (3-2) that is divided 3D Audio metadata.

In this case, in the in-frame DSE division information in the DSE2 of the AAC frame data (3), a value of the in-frame DSE division counter (dse_div_cnt) is "1", and a value of the in-frame DSE division termination flag (dse_div_terminate) is "1".

Therefore, the decoding device 51 reads divided 3D Audio metadata (1-1), divided 3D Audio metadata (1-2), divided 3D Audio metadata (2-1), divided 3D Audio metadata (2-2), divided 3D Audio metadata (3-1), and divided 3D Audio metadata (3-2), which are included in the AAC frame data (1) to (3), and then combines those pieces of divided 3D Audio metadata into one piece of 3D Audio metadata. Subsequently, by decoding one piece of obtained 3D Audio metadata, the representative value and the terminal value that have been described above are obtained.

<Explanation of Encoding Processing>

Figure 19:
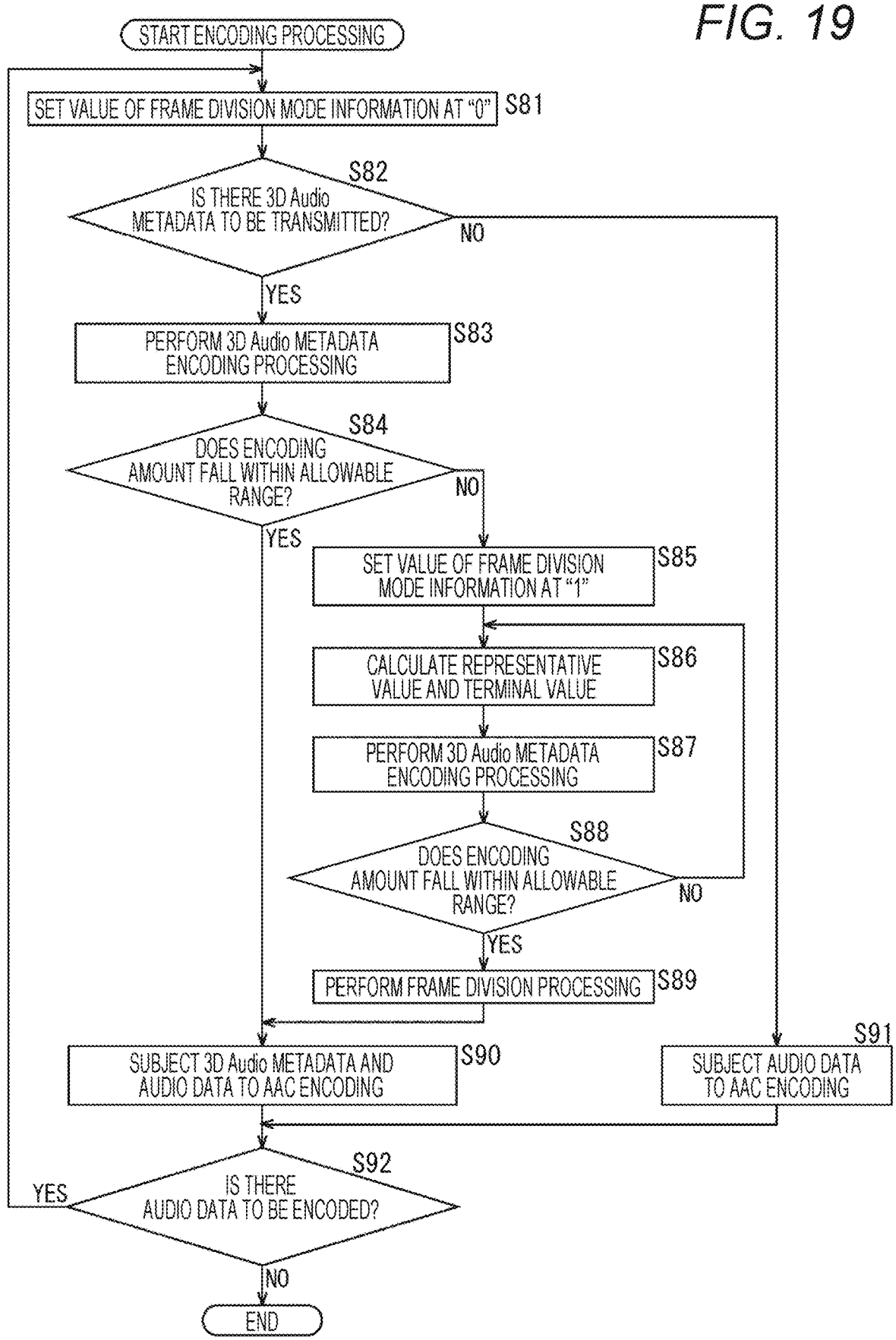
FIG. 19 is a flowchart illustrating encoding processing.

Next, encoding processing and decoding processing that are performed in a case where 3D Audio metadata is dividedly stored as appropriate will be described. First of all, encoding processing by the encoding device 11 will be described with reference to a flowchart shown in FIG. 19.

In step S81, with respect to a current frame to be processed, the 3D Audio metadata encoding unit 21 sets a value of frame division mode information (frm_div_mode) at "0".

Subsequently, in step S82, the 3D Audio metadata encoding unit 21 determines whether or not the current frame to be processed includes 3D Audio metadata to be transmitted. In step S82, processing similar to that in step S11 of FIG. 10 is performed.

In a case where it has been determined, in step S82, that there is 3D Audio metadata to be transmitted, in step S83, the 3D Audio metadata encoding unit 21 performs 3D Audio metadata encoding processing to encode 3D Audio metadata supplied from the outside. In step S83, processing similar to that in step S12 of FIG. 10 is performed.

In step S84, the 3D Audio metadata encoding unit 21 determines whether or not the encoding amount (data amount) of encoded 3D Audio metadata of the current frame to be processed, which has been obtained in the processing of step S83, falls within a predetermined allowable range.

Here, in a case where the data amount of encoded 3D Audio metadata is greater (larger) than a threshold value that is an allowable range, with the result that the encoded 3D Audio metadata cannot be entirely stored in the DSE of AAC frame data of the current frame, it is determined that the data amount of encoded 3D Audio metadata does not fall within the allowable range.

In a case where it has been determined, in step S84, that the encoding amount of encoded 3D Audio metadata falls within the allowable range, the 3D Audio metadata encoding unit 21 supplies the encoded 3D Audio metadata obtained in the processing of step S83 to the AAC encoding unit 22 as it is, and the process then proceeds to step S90.

In more detail, at this point, in a case where encoded 3D Audio metadata cannot be entirely stored in one DSE, the 3D Audio metadata encoding unit 21 divides the encoded 3D Audio metadata into some pieces of divided 3D Audio metadata. Subsequently, the 3D Audio metadata encoding unit 21 causes the respective pieces of divided 3D Audio metadata obtained by division to be stored in a plurality of DSEs in AAC frame data of the current frame.

In addition, the 3D Audio metadata encoding unit 21 also generates appropriate in-frame DSE division information and frame division information, and supplies those in-frame DSE division information and frame division information to the AAC encoding unit 22. in particular, here, the 3D Audio metadata of the current frame is stored in the AAC frame data of the current frame, and therefore a value of the frame division mode information (frm_div_mode) is set at "0". In other words, the frame division mode information set in step S81 is supplied to the AAC encoding unit 22 as it is.

It should be noted that division of the encoded 3D Audio metadata, and generation of the in-frame DSE division information and the frame division information, may be performed not in the 3D Audio metadata encoding unit 21 but in the AAC encoding unit 22.

Meanwhile, in a case where it has been determined, in step S84, that the encoding amount of encoded 3D Audio metadata does not fall within the allowable range, the process then proceeds to step S85.

In step S85, the 3D Audio metadata encoding unit 21 changes the value of the frame division mode information (frm_div_mode) of the current frame set in step S81 to "1".

In addition, the 3D Audio metadata encoding unit 21 treats, as the top frame of a division transmission time period, the frame that has been treated as the current frame until now.

The 3D Audio metadata encoding unit 21 treats a frame that is temporally subsequent to the top frame as a frame to be newly processed, and also obtains 3D Audio metadata of the frame to be newly processed. Moreover, with respect to 3D Audio metadata of frames in a division transmission time period, the 3D Audio metadata encoding unit 21 may reduce the data amount of 3D Audio metadata, for example, by deleting position information or the like of a low importance audio object or a moveless audio object as appropriate.

In step S86, the 3D Audio metadata encoding unit 21 calculates a representative value and a terminal value targeting at 3D Audio metadata of each frame from the top frame of the division transmission time period up to a frame that is treated as a frame to be processed at the present time.

In other words, the 3D Audio metadata encoding unit 21 considers that the frame that is treated as a frame to be processed at the present time is a terminal frame of the division transmission time period.

Subsequently, the 3D Audio metadata encoding unit 21 determines a representative value of 3D Audio metadata for the division transmission time period on the basis of 3D Audio metadata of each frame constituting the division transmission time period, in more detail, on the basis of 3D Audio metadata of each frame excluding the terminal frame. For example, when the representative value of 3D Audio metadata is determined, for example, computation for determining an average value is performed as necessary as described above, and a representative-value-applied frame to which the representative value is applied is also determined by the 3D Audio metadata encoding unit 21.

In addition, on the basis of, for example, 3D Audio metadata of the terminal frame of the division transmission time period, the 3D Audio metadata encoding unit 21 determines a terminal value that is the final 3D Audio metadata of the terminal frame.

The 3D Audio metadata encoding unit 21 treats the representative value and the terminal value, which have been determined in this manner, as 3D Audio metadata for the plurality of frames that constitutes the division transmission time period. In this case, the 3D Audio metadata encoding unit 21 functions as a metadata determination unit that determines the representative value and terminal value of the division transmission time period.

In step S87, the 3D Audio metadata encoding unit 21 performs 3D Audio metadata encoding processing by using, as 3D Audio metadata, the representative value and the terminal value that have been obtained in step S86, and encodes 3D Audio metadata.

In step S88, the 3D Audio metadata encoding unit 21 determines whether or not the encoding amount (data amount) of encoded 3D Audio metadata obtained by the processing of step S87 falls within an allowable range that is determined by the number of frames constituting the division transmission time period.

Here, in a case where the data amount of encoded 3D Audio metadata is greater (larger) than a threshold value that is an allowable range, with the result that the encoded 3D Audio metadata cannot be entirely stored in the DSEs of AAC frame data of all frames that constitute the division transmission time period, it is determined that the data amount of encoded 3D Audio metadata does not fall within the allowable range.

In a case where it has been determined, in step S88, that the encoding amount of encoded 3D Audio metadata does not fall within the allowable range, the data amount of 3D Audio metadata is still too much for the division transmission time period, and therefore the process returns to step S86, and the above-described processing is repeatedly performed. At this point, a frame that is temporally subsequent to the terminal frame of the time period, which is the division transmission time period until now, is treated as a terminal frame of a new division transmission time period.

Meanwhile, in a case where it has been determined, in step S88, that the encoding amount of encoded 3D Audio metadata falls within the allowable range, the 3D Audio metadata encoding unit 21 performs frame division processing in step S89.

In other words, the 3D Audio metadata encoding unit 21 divides the encoded 3D Audio metadata obtained in the processing of step S87 into a plurality of pieces of divided 3D Audio metadata. In the example shown in, for example, FIG. 18, the encoded 3D Audio metadata is divided into divided 3D Audio metadata (1-1) to divided 3D Audio metadata (3-2).

In addition, according to a result of dividing 3D Audio metadata, the division transmission time period, or the like, the 3D Audio metadata encoding unit 21 also generates frame division information including frame division mode information having a value of "1" determined in step S85, and in-frame DSE division information. Here, the frame division information is generated for each frame of the division transmission time period; and the in-frame DSE division information is generated for each DSE of each frame of the division transmission time period.

In addition, the 3D Audio metadata encoding unit 21 supplies the in-frame DSE division information and the frame division information that have been generated, and the divided 3D Audio metadata to the AAC encoding unit 22, and subsequently the process proceeds to step S90. It should be noted that the frame division processing in step S89 may be performed by the AAC encoding unit 22.

In a case where it has been determined, in step S84, that the encoding amount of encoded 3D Audio metadata falls within the allowable range, or when the processing of step S89 is performed, processing of step S90 is then performed.

In step S90, the AAC encoding unit 22 subjects the encoded 3D Audio metadata, the in-frame DSE division information, and the frame division information that have been supplied from the 3D Audio metadata encoding unit 21, and the audio data supplied from the outside, to AAC encoding to generate a 3D AAC bit stream.

Specifically, the AAC encoding unit 22 stores the in-frame DSE division information and the frame division information in the DSE of the AAC frame data according to the syntax shown in FIGS. 15 to 17, and also stores divided encoded 3D Audio metadata in the DSE as appropriate.

For example, when 3D Audio metadata is transmitted over a plurality of frames, the AAC encoding unit 22 stores respective pieces of divided 3D Audio metadata, which have been obtained by dividing 3D Audio metadata for the plurality of frames, in the respective DSEs of the plurality of frames of the division transmission time period. In that case, the AAC encoding unit 22 also stores the frame division information including frame division mode information having an appropriate value, and including an applied frame index, and also stores the in-frame DSE division information as appropriate in the DSEs.

In addition, the AAC encoding unit 22 encodes the audio data supplied from the outside by the AAC encoding method, and stores the encoded audio data in the SCE, the CPE, the LFE, or the like of the AAC frame data as AAC audio element data. Moreover, the AAC encoding unit 22 also stores 3D Audio component information supplied from the outside, and position information indicating the position of the audio object on the two-dimensional plane in the PCE of the AAC frame data.

The AAC encoding unit 22 outputs (transmits) the 3D AAC bit stream that includes the AAC frame data for one frame or a plurality of frames obtained in this manner, and subsequently the process proceeds to step S92.

In addition, in a case where it is determined, in step S82, that there is no 3D Audio metadata to be transmitted, the process then proceeds to step S91.

In step S91, the AAC encoding unit 22 subjects audio data supplied from the outside to AAC encoding.

In other words, the AAC encoding unit 22 encodes audio data for one frame supplied from the outside by the AAC encoding method, and stores the encoded audio data in AAC frame data. In addition, the AAC encoding unit 22 also stores 3D Audio component information supplied from the outside, and position information indicating the position of the audio object on the two-dimensional plane in the PCE of the AAC frame data.

The AAC encoding unit 22 outputs the 3D AAC bit stream that includes AAC frame data for one frame obtained in this manner, and subsequently the process proceeds to step S92.

Incidentally, although the example in which a previous frame reference flag is not used has been described here, it is needless to say that the previous frame reference flag may be used.

In such a case, in step S90, the previous frame reference flag is stored in the DSE. In addition, in a case where it is determined, in step S82, that there is no 3D Audio metadata to be transmitted, processing similar to that from step S14 to step S16 in FIG. 10 is then performed.

Processing of step S90 or processing of step S91 is performed, and subsequently processing of step S92 is performed.

In step S92, the encoding device 11 determines whether or not there is audio data to be encoded.

In a case where it has been determined, in step S92, that there is still audio data to be encoded, the process returns to step S81, and the above-described processing is repeatedly performed.

Meanwhile, in a case where it has been determined, in step S92, that there is no audio data to be encoded, in other words, audio data of content to be transmitted has been all encoded and output, the encoding processing ends.

As described above, the encoding device 11 stores the 3D Audio metadata in the DSE, and generates a 3D AAC bit stream. Performing the processing in such a manner enables the existing AAC standards to be extended, and 3D Audio reproduction to be performed by using the 3D Audio metadata on the decoding side. As the result, convenience can be enhanced. In particular, in a case where 3D Audio metadata cannot be entirely stored in AAC frame data for one frame, the representative value and the terminal value are handled as 3D Audio metadata, and the 3D Audio metadata is stored in AAC frame data over a plurality of frames, which enables 3D Audio metadata to be efficiently transmitted.

<Explanation of Decoding Processing>

Figure 20:
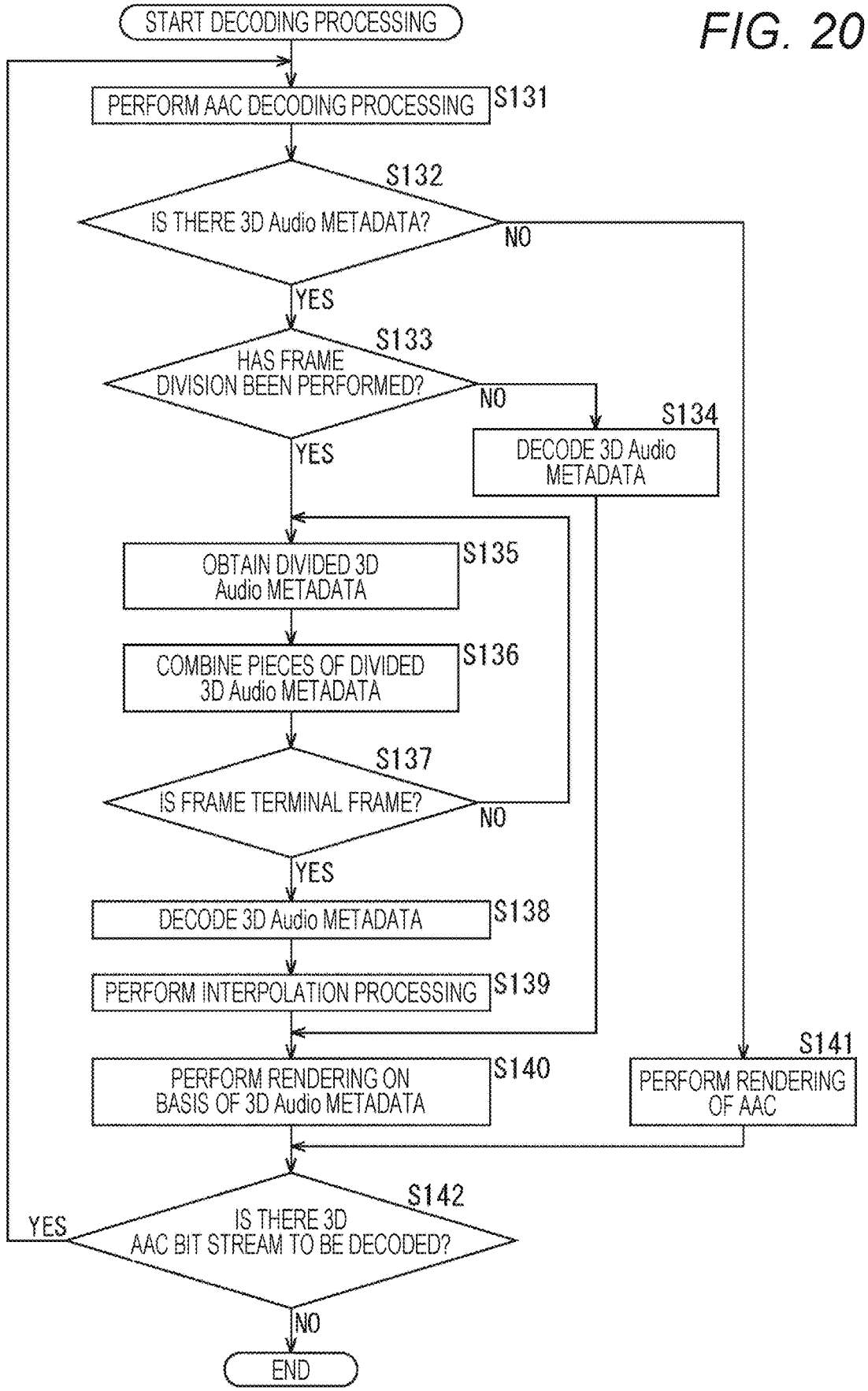
FIG. 20 is a flowchart illustrating decoding processing.

Next, decoding processing performed by the decoding device 51 will be described with reference to a flowchart shown in FIG. 20.

In step S131, the AAC decoding unit 61 subjects a received 3D AAC bit stream to AAC decoding processing that is decoding processing by a decoding method corresponding to the AAC encoding method.

Figure 11:
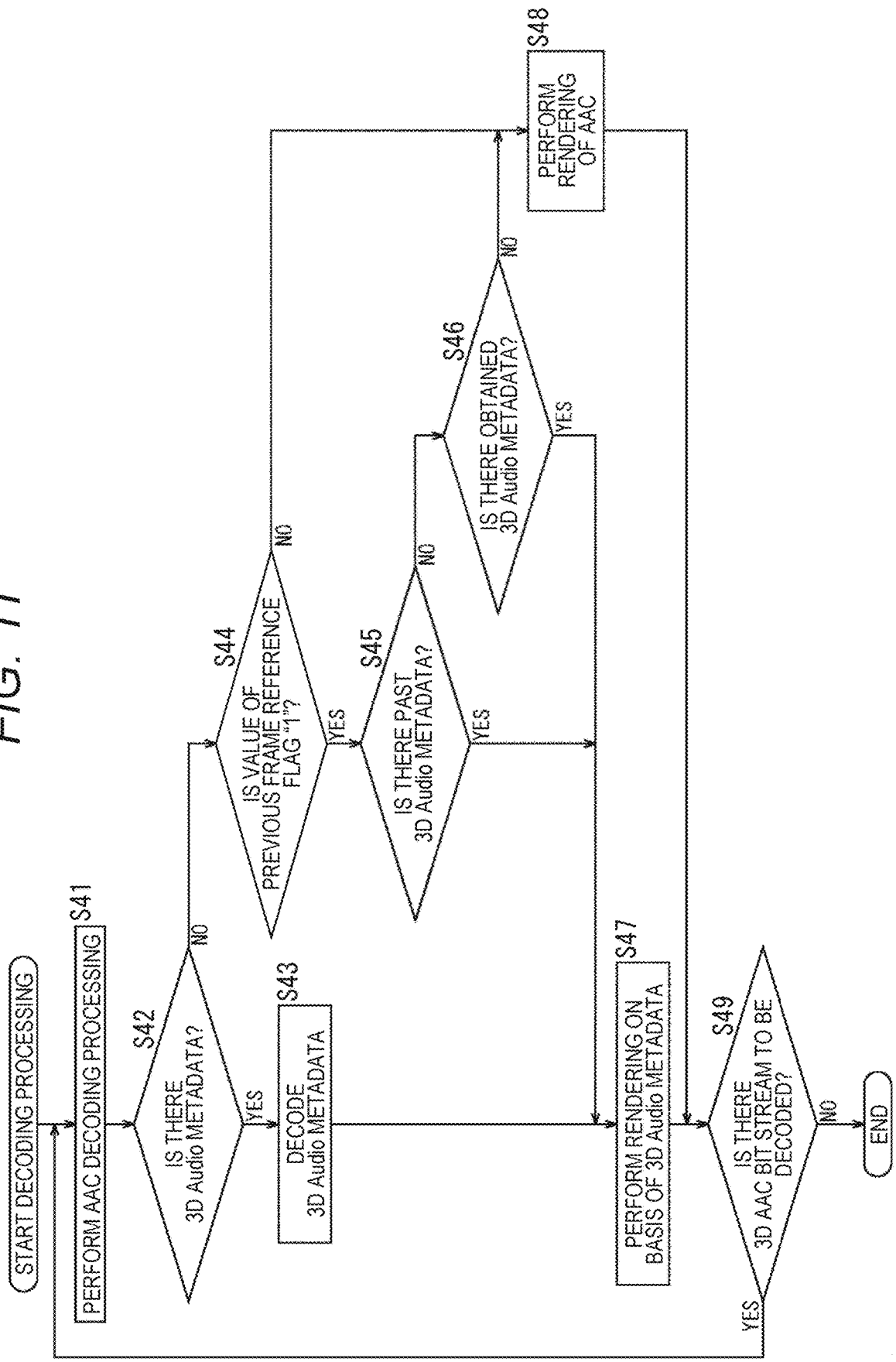
FIG. 11 is a flowchart illustrating decoding processing.

In step S131, processing similar to that of step S41 in FIG. 11 is performed, 3D Audio component information obtained by decoding is supplied to an upper level control unit, position information of each audio object on the two-dimensional plane is read, and audio data obtained by decoding is supplied to the 3D Audio renderer 64.

In step S132, the AAC decoding unit 61 determines whether or not there is 3D Audio metadata in the DSE of AAC frame data of the 3D AAC bit stream.

In a case where it has been determined, in step S132, that there is 3D Audio metadata, the process then proceeds to step S133.

In step S133, on the basis of frame division mode information (frm_div_mode) stored in the DSE of the AAC frame data, the AAC decoding unit 61 determines whether or not frame division has been performed. For example, in a case where the frame division mode information has a value of "1", it is determined that frame division has been performed, in other words, one piece of 3D Audio metadata is recorded in AAC frame data over a plurality of frames.

In a case where it has been determined, in step S133, that frame division has not been performed, in other words, in a case where the frame division mode information has a value of "0", the process proceeds to step S134.

In this case, the AAC decoding unit 61 reads encoded 3D Audio metadata from the DSE of AAC frame data for one frame, and supplies the encoded 3D Audio metadata to the 3D Audio metadata decoding unit 62.

It should be noted that in a case where 3D Audio metadata is dividedly stored in the plurality of DSEs of AAC frame data for one frame at this point, the AAC decoding unit 61 refers to in-frame DSE division information of each DSE, and reads divided 3D Audio metadata from those DSEs. In other words, respective pieces of divided 3D Audio metadata obtained by dividing 3D Audio metadata for one frame are read from the plurality of DSEs of AAC frame data for one frame.

Subsequently, the AAC decoding unit 61 combines the pieces of divided 3D Audio metadata read from the respective DSEs into one piece of encoded 3D Audio metadata, and supplies the one piece of encoded 3D Audio metadata to the 3D Audio metadata decoding unit 62.

In step S134, the 3D Audio metadata decoding unit 62 decodes the encoded 3D Audio metadata supplied from the AAC decoding unit 61, and supplies 3D Audio metadata for one frame obtained as a result thereof to the 3D Audio renderer 64.

After the 3D Audio metadata has been obtained in this manner, the process then proceeds to step S140.

Meanwhile, in a case where it has been determined, in step S133, that frame division has been performed, the AAC decoding unit 61 obtains (reads) divided 3D Audio metadata from the DSE of AAC frame data for one frame in step S135.

In this case as well, in a case where divided 3D Audio metadata is stored in a plurality of DSEs in AAC frame data for one frame, in-frame DSE division information is referred to, and pieces of divided 3D Audio metadata are read from those DSEs.

In step S136, the AAC decoding unit 61 combines the pieces of divided 3D Audio metadata obtained from the top frame of the division transmission time period by the processing until now. With respect to the processing of combining the pieces of divided 3D Audio metadata, the AAC decoding unit 61 performs combination with reference to the frame division information read from the DSE as appropriate.

In step S137, the AAC decoding unit 61 determines whether or not the frame processed in immediately preceding step S135 is a terminal frame of the division transmission time period. For example, in a case where the frame division termination flag (frm_div_terminate) of the frame processed in immediately preceding step S135 has a value of "1", the AAC decoding unit 61 determines that the frame processed in immediately preceding step S135 is a terminal frame.

In a case where it has been determined, in step S137, that the frame processed in immediately preceding step S135 is not a terminal frame, a frame in which divided 3D Audio metadata has not yet been read exists in the division transmission time period, and therefore the process returns to step S135, and the above-described processing is repeatedly performed. In other words, divided 3D Audio metadata is read from the next frame.

Meanwhile, in a case where it has been determined, in step S137, that the frame processed in immediately preceding step S135 is a terminal frame, encoded 3D Audio metadata for the division transmission time period has been obtained by the processing of step S136 performed immediately therebefore, and therefore the process then proceeds to step S138.

At this point, the AAC decoding unit 61 supplies encoded 3D Audio metadata for the division transmission time period obtained by combination, and information such as an applied frame index (apply_frm_Index) read from the in-frame DSE division information and frame division information of the DSE for the division transmission time period, to the 3D Audio metadata decoding unit 62. As the result, the 3D Audio metadata decoding unit 62 is capable of identifying the number of frames that constitute the division transmission time period, and a specific frame to which the representative value is applied.

In step S138, the 3D Audio metadata decoding unit 62 decodes encoded 3D Audio metadata of the division transmission time period, the encoded 3D Audio metadata having been supplied from the AAC decoding unit 61. Consequently, the representative value and terminal value for the division transmission time period are obtained.

In step S139, the 3D Audio metadata decoding unit 62 performs interpolation processing on the basis of: the representative value and terminal value obtained by the processing of step S138; 3D Audio metadata of the frame immediately before the division transmission time period, the 3D Audio metadata having already been obtained; and the applied frame index.

For example, in the interpolation processing, as described with reference to FIG. 14, by using 3D Audio metadata of the frame immediately before the division transmission time period, and the representative value, 3D Audio metadata of each of frames from the top frame of the division transmission time period to the frame immediately before the frame to which the representative value is applied is calculated by interpolation.

Similarly, by using the representative value and the terminal value, 3D Audio metadata of each of frames from the frame immediately after the frame to which the representative value is applied to the frame immediately before the terminal frame of the division transmission time period is calculated by interpolation.

In this case, the 3D Audio metadata decoding unit 62 functions as a metadata generation unit that performs interpolation processing to generate 3D Audio metadata of each frame of the division transmission time period.

As the result of such processing, pieces of 3D Audio metadata of respective frames of the division transmission time period are obtained. It should be noted that at the time of interpolation processing, information including the applied frame index, which has been supplied from the AAC decoding unit 61, is referred to as appropriate.

After the pieces of 3D Audio metadata of the respective frames of the division transmission time period are obtained, the 3D Audio metadata decoding unit 62 supplies those pieces of 3D Audio metadata to the 3D Audio renderer 64, and subsequently the process proceeds to step S140.

The processing of step S134 or step S139 is performed, with the result that 3D Audio metadata of one or a plurality of frames is obtained, and subsequently processing of step S140 is performed.

In other words, in step S140, the 3D Audio renderer 64 performs rendering on the basis of the 3D Audio metadata supplied from the 3D Audio metadata decoding unit 62, and the audio data supplied from the AAC decoding unit 61. It should be noted that in step S140, processing similar to that in step S47 of FIG. 11 is performed.

After reproduction data has been obtained by rendering, the 3D Audio renderer 64 outputs the obtained reproduction data, and subsequently the process proceeds to step S142.

Meanwhile, in a case where it has been determined, in step S132, that there is no 3D Audio metadata, processing of step S141 is then performed.

In other words, in step S141, the 3D Audio renderer 64 performs rendering defined by the ordinary AAC standards on the basis of the audio data supplied from the AAC decoding unit 61, and outputs reproduction data obtained as a result thereof. In step S141, processing similar to that in step S48 of FIG. 11 is performed.

In this manner, after reproduction data is output, the process then proceeds to step S142.

Incidentally, although the example in which a previous frame reference flag is not used has been described here, it is needless to say that the previous frame reference flag may be used.

In such a case, in a case where it has been determined, in step S132, that there is no 3D Audio metadata, processing similar to that in steps S44 to S46 and S48 of FIG. 11 are then performed.

After the processing of step S140 or step S141 is performed, the AAC decoding unit 61 determines, in step S142, whether or not there is a 3D AAC bit stream to be decoded.

In a case where it has been determined, in step S142, that there is a 3D AAC bit stream to be decoded, the process returns to step S131, and the above-described processing is repeatedly performed.

Meanwhile, in a case where it has been determined, in step S142, that there is no 3D AAC bit stream to be decoded, the decoding processing ends.

As described above, the decoding device 51 reads 3D Audio metadata from the DSE, and performs rendering by using the read 3D Audio metadata. Performing the processing in such a manner enables 3D Audio reproduction to be performed with the existing AAC standards extended, and consequently convenience can be enhanced.

In particular, when 3D Audio metadata of a division transmission time period is stored in AAC frame data over a plurality of frames, by performing interpolation processing on the basis of a representative value as 3D Audio metadata and a terminal value to obtain 3D Audio metadata of each frame, 3D Audio can be efficiently reproduced even if the encoding amount is small.

As described above, according to the present technology, 3D Audio data can be transmitted within the standards of the existing audio codec having an ancillary data area without depending on audio codec (encoding method).

In addition, in a case where the size of an ancillary data area such as a DSE is limited, 3D Audio metadata can be transmitted by dividing the 3D Audio metadata, and then by storing the pieces of divided 3D Audio metadata in a plurality of ancillary data areas in a distributed manner.

Moreover, by transmitting position information indicating a position of an audio object on a two-dimensional plane, in other words, information (speaker arrangement information) related to channel mapping, with the position information stored in a PCE or the like, using the position information as much as possible enables audio reproduction to be performed even in the existing decoding device that does not support 3D Audio.

<Configuration Example of Computer>

Incidentally, the series of processing described above can be executed by hardware, and can also be executed by software. In a case where the series of processing is executed by software, a program that configures the software is installed in a computer. Here, the computer includes a computer that is built into dedicated hardware, and a computer that is capable of executing various kinds of functions by installing various kinds of programs, for example, a general-purpose personal computer and the like.

Figure 21:
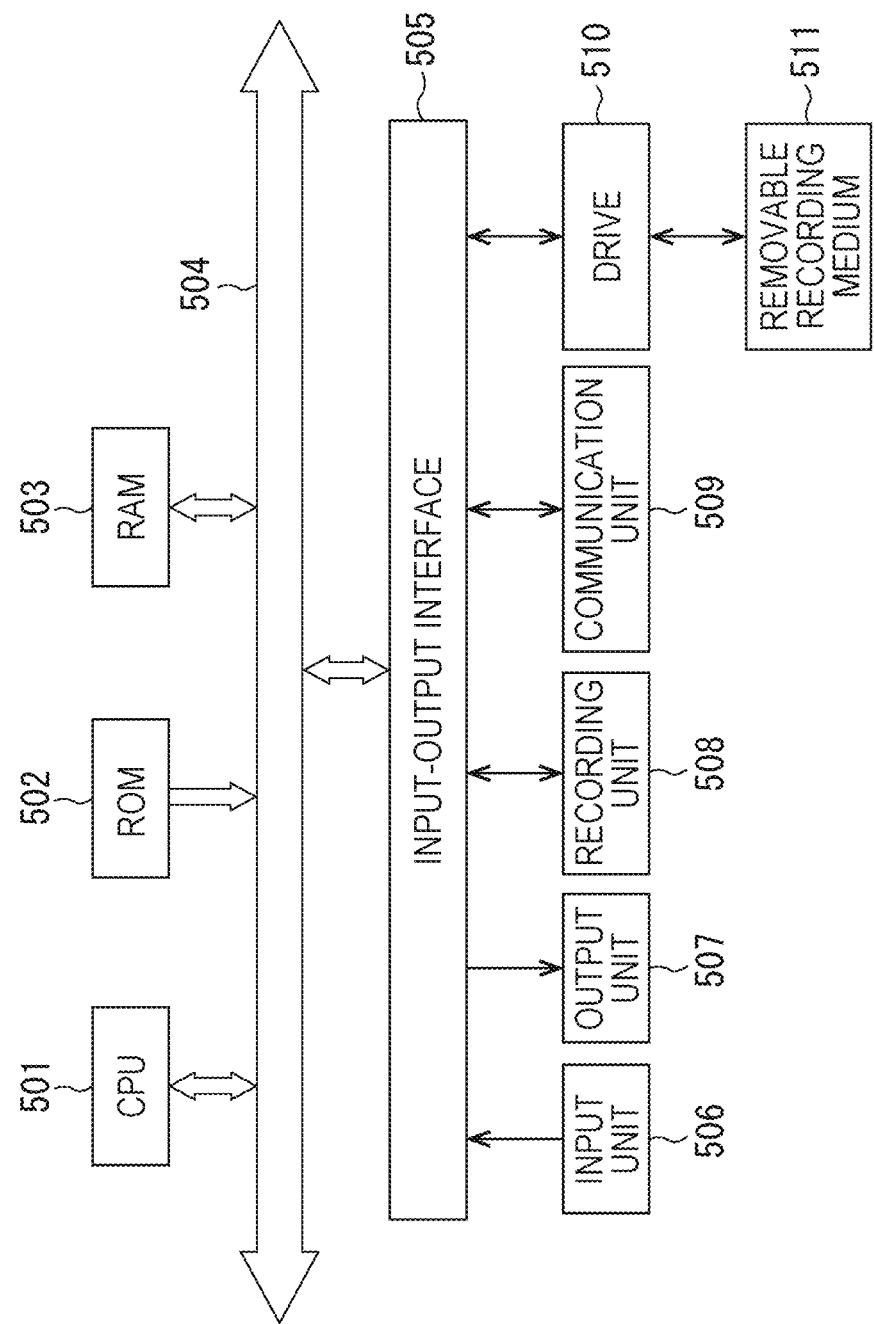
FIG. 21 is a diagram illustrating a configuration example of a computer.

FIG. 21 is a block diagram illustrating a hardware configuration example of a computer that executes the above-described series of processing by a program.

In the computer, a central processing unit (CPU) 501, a Read Only Memory (ROM) 502, and a random access memory (RAM) 503 are mutually connected through a bus 504.

An input-output interface 505 is further connected to the bus 504. An input unit 506, an output unit 507, a recording unit 508, a communication unit 509, and a drive 510 are connected to the input-output interface 505.

The input unit 506 includes a keyboard, a mouse, a microphone, an image pickup element, and the like. The output unit 507 includes a display, a speaker, and the like. The recording unit 508 includes a hard disk, a nonvolatile memory, and the like. The communication unit 509 includes a network interface and the like. The drive 510 drives a removable recording media 511 such as a magnetic disk, an optical disk, a magneto-optical disk, or a semiconductor memory.

In the computer that is configured as described above, the CPU 501 loads, for example, a program stored in the recording unit 508 into the RAM 503 through the input-output interface 505 and the bus 504, then executes the program, and consequently the above-described series of processing is performed.

The program executed by the computer (CPU 501) can be provided by being recorded, for example, in a removable recording media 511 such as a package media. In addition, the program can be provided through a wired or wireless transmission medium such as a local area network, the Internet, and digital satellite broadcasting.

In the computer, the program can be installed in the recording unit 508 through the input-output interface 505 by mounting the removable recording media 511 to the drive 510. In addition, the program can be received by the communication unit 509 through a wired or wireless transmission medium, and can be installed in the recording unit 508. Besides the above, the program can be installed in the ROM 502 or the recording unit 508 beforehand.

It should be noted that the program executed by the computer may be a program in which processing is time-sequentially performed along the order described in the present description, or may be a program in which processing is performed in parallel or in the required timing, for example, when a call is made.

In addition, embodiments of the present technology are not limited to the embodiments described above. Various modifications can be made within the scope that does not deviate from the gist of the present technology.

For example, the present technology can be configured as cloud computing in which one function is processed by being shared by a plurality of devices in cooperation through a network.

Further, each step explained in the above-described flowchart is executed by one device. Alternatively, the each step can be executed by being shared by a plurality of devices.

Furthermore, in a case where one step includes a plurality of pieces of processing, the plurality of pieces of processing included in the one step is executed by one device. Alternatively, the plurality of pieces of processing can be executed by being shared by a plurality of devices.

Moreover, the present technology may have the following configuration.

(1) A decoding device including:
a decoding unit that decodes audio data including an object audio, the audio data being included in an encoded bit stream, and reads metadata of the object audio from an area in which arbitrary data of the encoded bit stream can be stored; and
an output unit that outputs the decoded audio data on the basis of the metadata.

(2) The decoding device set forth in (1), in which
from a respective plurality of the areas in the encoded bit stream for one frame, the decoding unit reads a plurality of pieces of data obtained by dividing the metadata, and obtains the metadata on the basis of the plurality of pieces of data.

(3) The decoding device set forth in (1), in which
from a respective plurality of the areas of a plurality of frames in the encoded bit stream, the decoding unit reads a plurality of pieces of data obtained by dividing the metadata, and obtains the metadata for the plurality of frames on the basis of the plurality of pieces of data.

(4) The decoding device set forth in (3), in which
the metadata for the plurality of frames includes a representative value of the metadata for a time period including the plurality of frames, and a terminal value that is the metadata in a terminal frame of the time period.

(5) The decoding device set forth in (4), in which
the decoding unit further includes a metadata generation unit that further reads, from the area, applied frame information indicating a frame, the representative value of which is used as the metadata, and
generates the metadata of frames in the time period by performing interpolation processing on the basis of the representative value, the terminal value, and the applied frame information.

(6) The decoding device set forth in any one of (1) to (5), in which
on the basis of the metadata that has been read temporally last among the pieces of metadata read from the areas in frames before a predetermined frame, the output unit outputs the decoded audio data of the predetermined frame.

(7) The decoding device set forth in (6), in which
according to an instruction as to whether to use the metadata that has been read last, the output unit outputs the decoded audio data of the predetermined frame on the basis of the metadata that has been read last.

(8) The decoding device set forth in any one of (1) to (5), in which
in a case where the metadata of a predetermined frame could not have been obtained, the output unit outputs the decoded audio data of the predetermined frame on the basis of another metadata that differs from the metadata read from the area.

(9) The decoding device set forth in any one of (1) to (8), in which
the encoded bit stream includes an AAC bit stream, and
the decoding unit reads the metadata from a DSE that is the area.

(10) The decoding device set forth in any one of (1) to (9), in which
the encoded bit stream includes an AAC bit stream, and
the decoding unit reads configuration information of the audio data, or speaker arrangement information of the audio data, from a PCE of the AAC bit stream.

(11) A decoding method, by a decoding device, including the steps of:
decoding audio data including an object audio, the audio data being included in an encoded bit stream, and reading metadata of the object audio from an area in which arbitrary data of the encoded bit stream can be stored; and
outputting the decoded audio data on the basis of the metadata.

(12) A program that causes a computer to execute processing including the steps of:
decoding audio data including an object audio, the audio data being included in an encoded bit stream, and reading metadata of the object audio from an area in which arbitrary data of the encoded bit stream can be stored; and
outputting the decoded audio data on the basis of the metadata.

(13) An encoding device including
an encoding unit that encodes audio data including an object audio, and stores metadata of the object audio in an area in which arbitrary data can be stored, to generate an encoded bit stream that includes the metadata, and the encoded audio data.

(14) The encoding device set forth in (13), in which
the encoding unit stores a plurality of pieces of data obtained by dividing the metadata in a respective plurality of the areas in the encoded bit stream for one frame.

(15) The encoding device set forth in (13), in which
the encoding unit stores a plurality of pieces of data in a respective plurality of the areas of a plurality of frames in the encoded bit stream, the plurality of pieces of data having been obtained by dividing the metadata for the plurality of frames.

(16) The encoding device set forth in (15), further including
a metadata determination unit that determines a representative value of the metadata for a time period including the plurality of frames, and uses the representative value as the metadata for the plurality of frames.

(17) The encoding device set forth in (16), in which
the metadata determination unit determines a terminal value that is the metadata in a terminal frame of the time period, and uses the representative value and the terminal value as the metadata for the plurality of frames.

(18) The encoding device set forth in (16) or (17), in which
the encoding unit stores, in the area, applied frame information indicating a frame that uses the representative value as the metadata.

(19) The encoding device set forth in any one of (13) to (18), in which
the encoding unit stores, in the area, information that gives an instruction as to whether to use, as the metadata of a predetermined frame, the metadata of a frame nearest to the predetermined frame among the pieces of metadata stored in the areas of frames temporally before the predetermined frame.

(20) The encoding device set forth in any one of (13) to (19), in which
the encoded bit stream includes an AAC bit stream, and
the encoding unit stores the metadata in a DSE that is the area.

(21) The encoding device set forth in any one of (13) to (20), in which
the encoded bit stream includes an AAC bit stream, and
the encoding unit stores configuration information of the audio data, or speaker arrangement information of the audio data, in a PCE of the AAC bit stream.

(22) An encoding method, by an encoding device, including
a step of encoding audio data including an object audio, and storing metadata of the object audio in an area in which arbitrary data can be stored, to generate an encoded bit stream that includes the metadata, and the encoded audio data.

(23) A program that causes a computer to execute processing including
a step of encoding audio data including an object audio, and storing metadata of the object audio in an area in which arbitrary data can be stored, to generate an encoded bit stream that includes the metadata, and the encoded audio data.

REFERENCE SIGNS LIST

11 Encoding device
21 3D Audio metadata encoding unit
22 AAC encoding unit
51 Decoding device
61 AAC decoding unit
62 3D Audio metadata decoding unit
63 3D Audio metadata obtaining unit
64 3D Audio renderer

The invention claimed is:
1. A decoding device comprising:
a decoding unit that decodes audio data including an object audio, the audio data being included in an encoded bit stream, and reads metadata of the object audio from an area in which arbitrary data of the encoded bit stream can be stored; and
an output unit that outputs the decoded audio data on a basis of the metadata.
2. The decoding device according to claim 1, wherein
from a respective plurality of the areas in the encoded bit stream for one frame, the decoding unit reads a plurality of pieces of data obtained by dividing the metadata, and obtains the metadata on a basis of the plurality of pieces of data.
3. The decoding device according to claim 1, wherein
from a respective plurality of the areas of a plurality of frames in the encoded bit stream, the decoding unit reads a plurality of pieces of data obtained by dividing the metadata, and obtains the metadata for the plurality of frames on a basis of the plurality of pieces of data.
4. The decoding device according to claim 3, wherein
the metadata for the plurality of frames includes a representative value of the metadata for a time period including the plurality of frames, and a terminal value that is the metadata in a terminal frame of the time period.
5. The decoding device according to claim 4, wherein
the decoding unit further includes a metadata generation unit that further reads, from the area, applied frame information indicating a frame, the representative value of which is used as the metadata, and
generates the metadata of frames in the time period by performing interpolation processing on a basis of the representative value, the terminal value, and the applied frame information.
6. The decoding device according to claim 1, wherein
on a basis of the metadata that has been read temporally last among the pieces of metadata read from the areas in frames before a predetermined frame, the output unit outputs the decoded audio data of the predetermined frame.
7. The decoding device according to claim 6, wherein
according to an instruction as to whether to use the metadata that has been read last, the output unit outputs the decoded audio data of the predetermined frame on a basis of the metadata that has been read last.
8. The decoding device according to claim 1, wherein
in a case where the metadata of a predetermined frame could not have been obtained, the output unit outputs the decoded audio data of the predetermined frame on a basis of another metadata that differs from the metadata read from the area.
9. The decoding device according to claim 1, wherein
the encoded bit stream includes an AAC bit stream, and
the decoding unit reads the metadata from a DSE that is the area.
10. The decoding device according to claim 1, wherein
the encoded bit stream includes an AAC bit stream, and
the decoding unit reads configuration information of the audio data, or speaker arrangement information of the audio data, from a PCE of the AAC bit stream.
11. A decoding method, by a decoding device, comprising the steps of:
decoding audio data including an object audio, the audio data being included in an encoded bit stream, and reading metadata of the object audio from an area in which arbitrary data of the encoded bit stream can be stored; and
outputting the decoded audio data on a basis of the metadata.
12. A non-transitory computer readable medium storing instructions that, when executed by processing circuitry, perform a decoding method comprising:
decoding audio data including an object audio, the audio data being included in an encoded bit stream, and reading metadata of the object audio from an area in which arbitrary data of the encoded bit stream can be stored; and outputting the decoded audio data on a basis of the metadata.

13. An encoding device comprising
an encoding unit that encodes audio data including an object audio, and stores metadata of the object audio in an area in which arbitrary data can be stored, to generate an encoded bit stream that includes the metadata, and the encoded audio data.

14. The encoding device according to claim 13, wherein the encoding unit stores a plurality of pieces of data obtained by dividing the metadata in a respective plurality of the areas in the encoded bit stream for one frame.

15. The encoding device according to claim 13, wherein the encoding unit stores a plurality of pieces of data in a respective plurality of the areas of a plurality of frames in the encoded bit stream, the plurality of pieces of data having been obtained by dividing the metadata for the plurality of frames.

16. The encoding device according to claim 15, further comprising
a metadata determination unit that determines a representative value of the metadata for a time period including the plurality of frames, and uses the representative value as the metadata for the plurality of frames.

17. The encoding device according to claim 16, wherein the metadata determination unit determines a terminal value that is the metadata in a terminal frame of the time period, and uses the representative value and the terminal value as the metadata for the plurality of frames.

18. The encoding device according to claim 16, wherein the encoding unit stores, in the area, applied frame information indicating a frame that uses the representative value as the metadata.

19. The encoding device according to claim 13, wherein the encoding unit stores, in the area, information that gives an instruction as to whether to use, as the metadata of a predetermined frame, the metadata of a frame nearest to the predetermined frame among the pieces of metadata stored in the areas of frames temporally before the predetermined frame.

20. The encoding device according to claim 13, wherein the encoded bit stream includes an AAC bit stream, and the encoding unit stores the metadata in a DSE that is the area.

21. The encoding device according to claim 13, wherein the encoded bit stream includes an AAC bit stream, and the encoding unit stores configuration information of the audio data, or speaker arrangement information of the audio data, in a PCE of the AAC bit stream.

22. An encoding method, by an encoding device, comprising
a step of encoding audio data including an object audio, and storing metadata of the object audio in an area in which arbitrary data can be stored, to generate an encoded bit stream that includes the metadata, and the encoded audio data.

23. A non-transitory computer readable medium storing instructions that, when executed by processing circuitry, perform an encoding method comprising:
encoding audio data including an object audio, and storing metadata of the object audio in an area in which arbitrary data can be stored, to generate an encoded bit stream that includes the metadata, and the encoded audio data.

* * * * *